(12) United States Patent
Ohba

(10) Patent No.: US 11,756,891 B2
(45) Date of Patent: Sep. 12, 2023

(54) SEMICONDUCTOR DEVICE AND METHOD FOR MANUFACTURING SAME

(71) Applicant: TOKYO INSTITUTE OF TECHNOLOGY, Tokyo (JP)

(72) Inventor: Takayuki Ohba, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 148 days.

(21) Appl. No.: 17/645,092

(22) Filed: Dec. 20, 2021

(65) Prior Publication Data
US 2022/0208683 A1 Jun. 30, 2022

(30) Foreign Application Priority Data
Dec. 25, 2020 (JP) ................ 2020-217060

(51) Int. Cl.
*H01L 23/538* (2006.01)
*H01L 25/065* (2023.01)
*H01L 21/50* (2006.01)
*H01L 23/12* (2006.01)

(52) U.S. Cl.
CPC ......... *H01L 23/5384* (2013.01); *H01L 21/50* (2013.01); *H01L 23/12* (2013.01); *H01L 25/0657* (2013.01); *H01L 2225/06541* (2013.01)

(58) Field of Classification Search
CPC .. H01L 23/5384; H01L 25/0657; H01L 21/50
See application file for complete search history.

(56) References Cited

U.S. PATENT DOCUMENTS

| 10,910,347 B2 * | 2/2021 | She .................. H01L 24/49 |
| 11,322,483 B1 * | 5/2022 | Ogawa .............. H01L 25/50 |
| 2005/0162946 A1 | 7/2005 | Koide |
| 2009/0014891 A1 | 1/2009 | Chang et al. |

FOREIGN PATENT DOCUMENTS

| JP | 2005-209814 | 8/2005 |
| TW | 200903773 | 1/2009 |

OTHER PUBLICATIONS

Office Action dated Nov. 15, 2022 with respect to the corresponding Taiwanese patent application No. 110148277.

* cited by examiner

*Primary Examiner* — Dale E Page
*Assistant Examiner* — Wilner Jean Baptiste
(74) *Attorney, Agent, or Firm* — IPUSA, PLLC

(57) ABSTRACT

A method for manufacturing a semiconductor device is provided. In the method, first substrate is prepared. Each of the first substrates has first product regions. The first substrates are stacked, thereby electrically connecting different layers of the first substrates via a through-electrode. A second substrates having second product regions is prepared. Second semiconductor chips are attached to the second product regions. The second semiconductor chips are attached to the second substrate on a top layer of the first substrates. The second substrate is removed from the second semiconductor chips. First electrode pads of the top layer are electrically connected to second electrode pads of the second semiconductor chips via through-electrodes. The second semiconductor chips are connected to each other in parallel. The first and second product regions are separated, thereby manufacturing semiconductor chip stacks including more semiconductor chips in the top layer than the other layers.

15 Claims, 29 Drawing Sheets

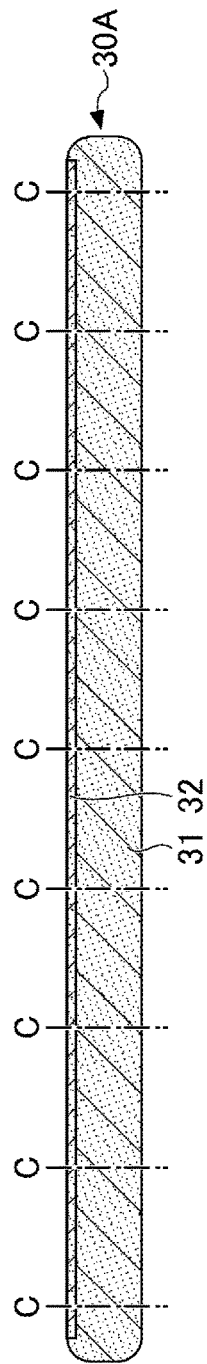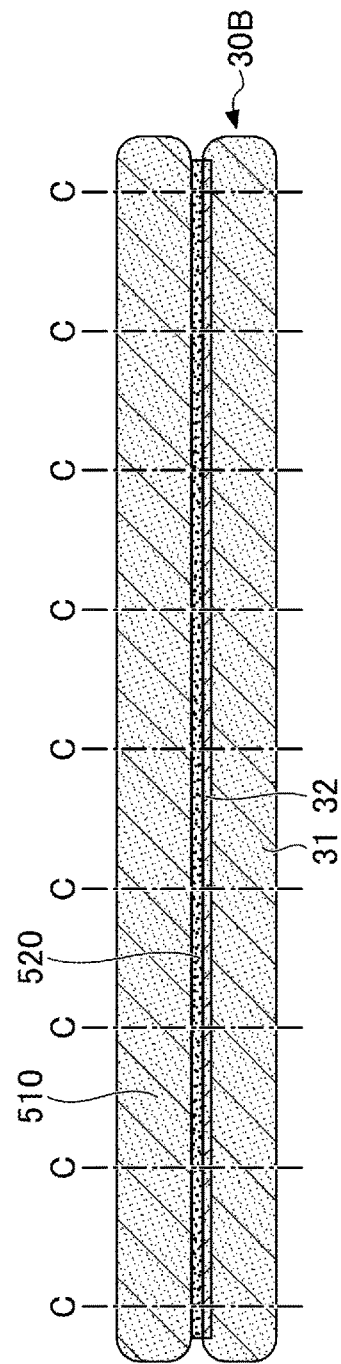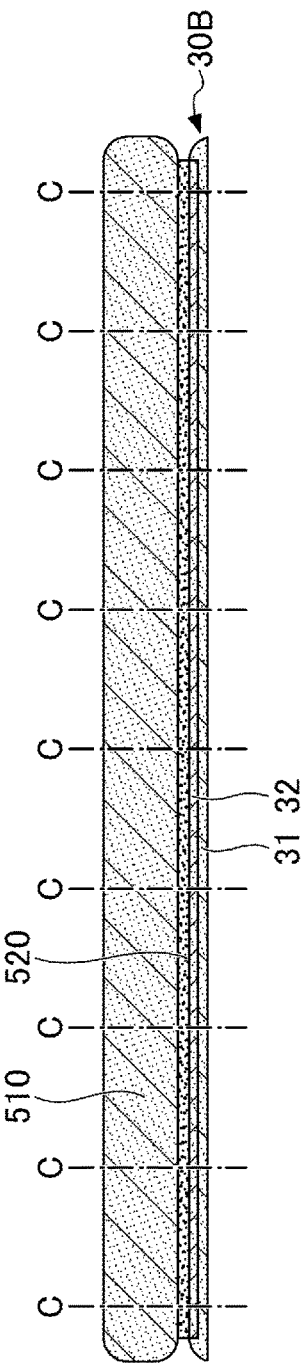

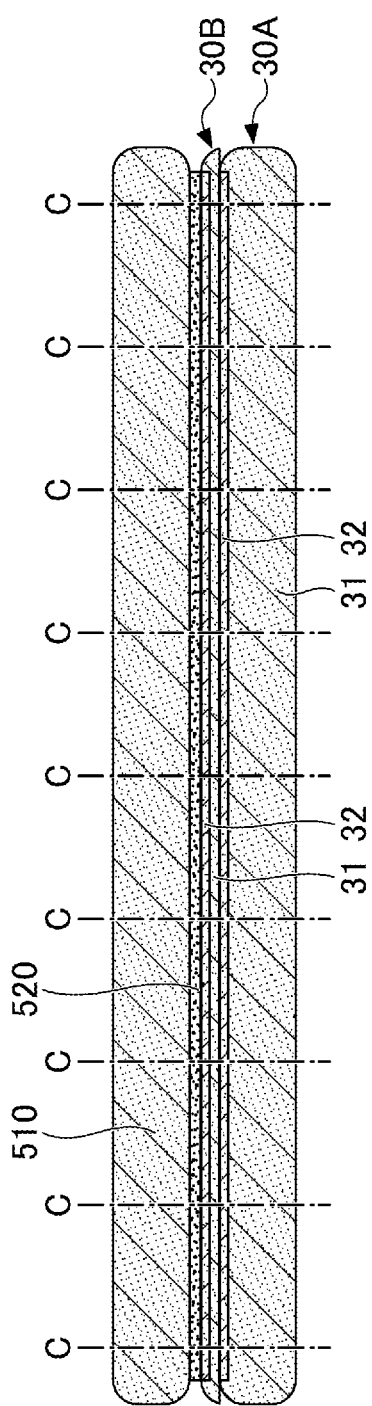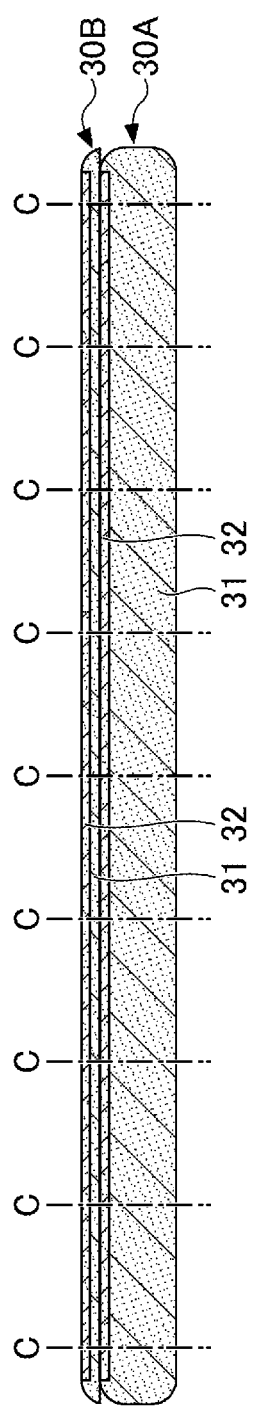

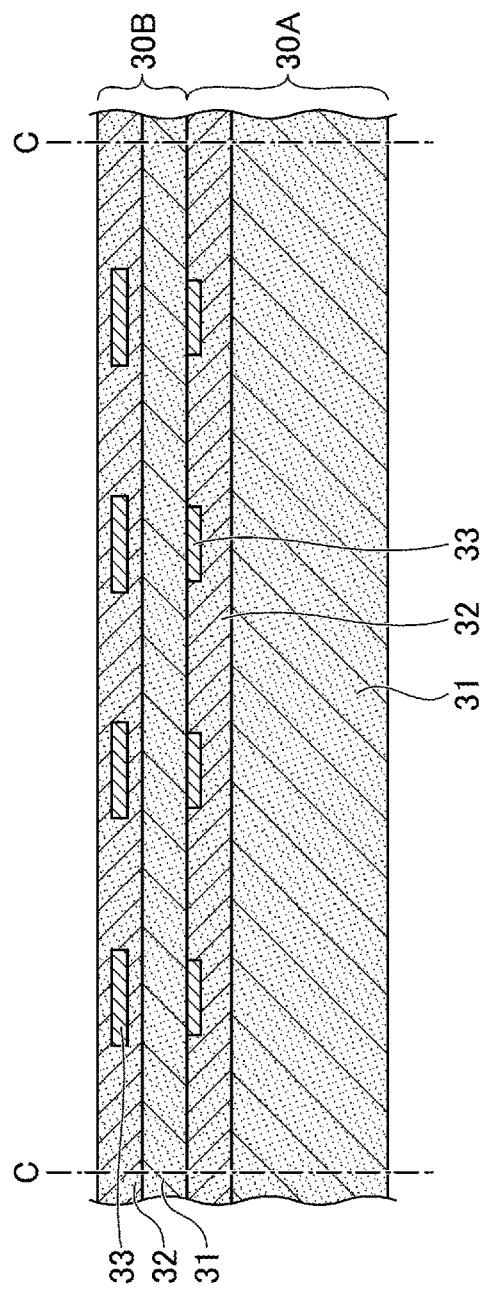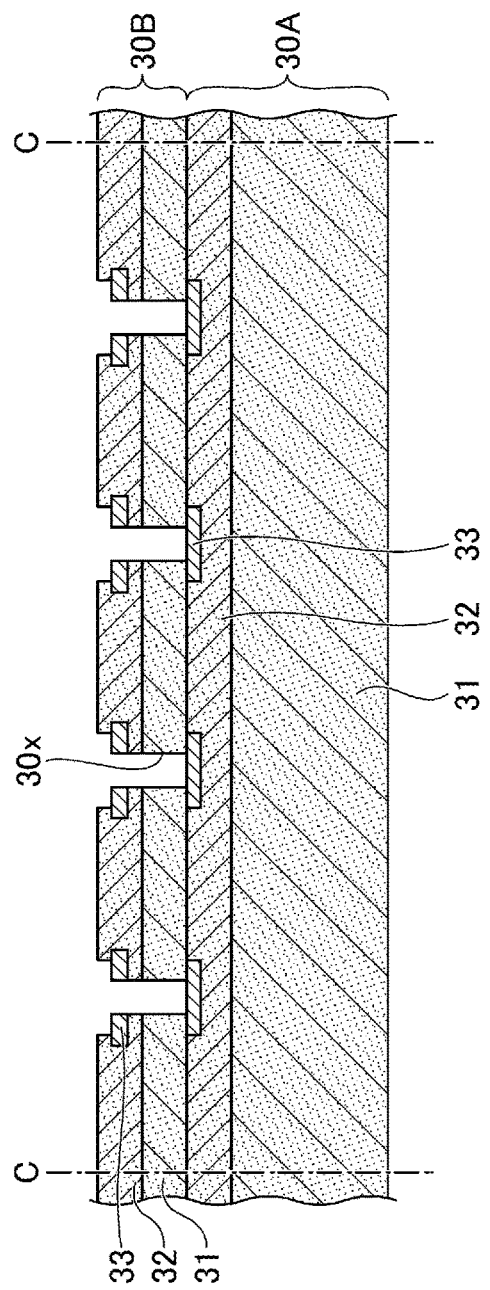

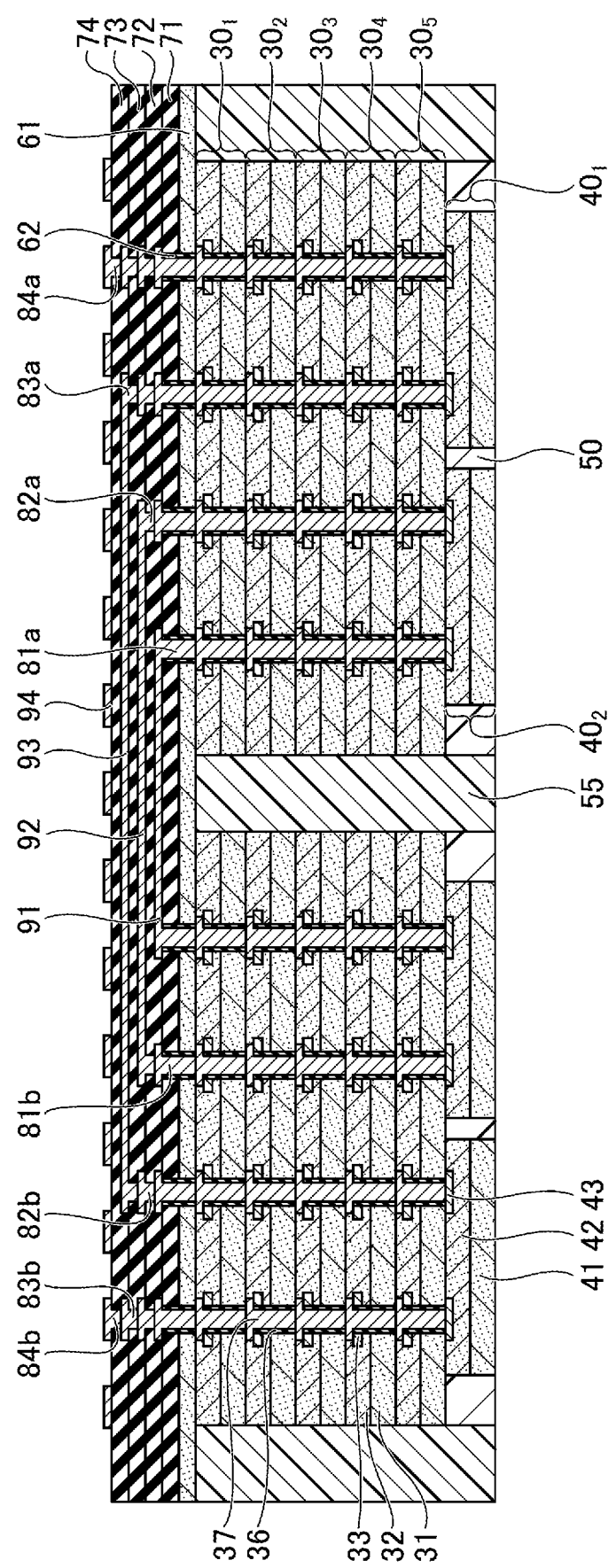

SEMICONDUCTOR DEVICE AND METHOD FOR MANUFACTURING SAME

CROSS-REFERENCE TO RELATED APPLICATION

The present application is based on and claims priority to Japanese Priority Application No. 2020-217060 filed on Dec. 25, 2020, the entire contents of which are hereby incorporated herein by reference.

BACKGROUND OF THE INVENTION

1. Field of the Invention

The present disclosure relates to a semiconductor device and a method for manufacturing the same.

2. Description of the Related Art

In recent years, semiconductor applied products have been rapidly reduced in size, thickness, and weight for various mobile device applications such as smartphones. Along with this, smaller sizes and higher densities are required for semiconductor devices mounted on semiconductor applied products. More recently, a combination of microprocessors and memories with high bandwidth performance and low power consumption has been needed. Therefore, semiconductor chip stacks including a plurality of stacked semiconductor chips have been proposed. The semiconductor chips to be stacked are, for example, memory chips or logic chips, as described in Japanese Patent Application Laid-Open No. 2005-209814.

The semiconductor chip stack as described above is, for example, mounted on an interposer, and is electrically connected to other semiconductor chips mounted, for example, on the same interposer, via an interconnection provided in the interposer. However, because a bump (such as a solder bump) is used to connect the semiconductor chip stack and the semiconductor chip to the interposer, the semiconductor chip stack is connected to the semiconductor chip via the bump and the interposer interconnection. For this reason, the high impedance of the portion connecting the semiconductor chip stack to the semiconductor chip has been a problem. Also, because a method of stacking chips separated from wafers is likely to take a long stacking cycle time, the method has had problems of high cost, and a probability of causing connection failures between chips due to mechanical bonding.

SUMMARY OF THE INVENTION

The present disclosure has been made in view of the above points, and is intended to decrease both impedance between semiconductor chips connected to each other and cost, and to increase reliability.

According to one embodiment of the present disclosure, there is provided a method for manufacturing a semiconductor device. In the method, a plurality of first substrates to be formed into a first semiconductor chip is prepared. Each of the plurality of first substrates has a plurality of first product regions defined thereon. The plurality of first substrates is stacked while facing a first electrode pad forming side of each of the plurality of first substrates in a same direction, thereby directly and electrically connecting different layers of the plurality of first substrates to each other via a through electrode. A second substrates having a plurality of second product regions defined thereon is prepared. A plurality of second semiconductor chips is attached to the plurality of second product regions of one face of the second substrate on one-to-one basis while facing a second electrode pad forming side of each of the plurality of second semiconductor chips in a same direction. The plurality of second semiconductor chips attached to the second substrate is stacked on the first electrode pad forming side of a top layer of the first substrates while facing the second electrode pad forming side in a same direction. The second substrate is removed from the second semiconductor chips. First electrode pads of the top layer of the first substrates are directly and electrically connected to second electrode pads of the plurality of second semiconductor chips via through-electrodes. The plurality of second semiconductor chips is connected to each other in parallel. Each of the plurality of first and second product regions are separated, thereby manufacturing a plurality of semiconductor chip stacks including more semiconductor chips in the top layer than the other layers.

BRIEF DESCRIPTION OF THE DRAWINGS

FIG. 3 is a second diagram illustrating a manufacturing process of a semiconductor device according to the first embodiment;

FIG. 4 is a third diagram illustrating a manufacturing process of a semiconductor device according to the first embodiment;

FIG. 5 is a fourth diagram illustrating a manufacturing process of a semiconductor device according to the first embodiment;

FIG. 6 is a fifth diagram illustrating a manufacturing process of a semiconductor device according to the first embodiment;

FIG. 7 is a sixth diagram illustrating a manufacturing process of a semiconductor device according to the first embodiment;

FIG. 8 is a seventh diagram illustrating a manufacturing process of a semiconductor device according to the first embodiment;

FIG. 9 is an eighth diagram illustrating a manufacturing process of a semiconductor device according to the first embodiment;

FIG. 37 is a fourth diagram illustrating a manufacturing process of the semiconductor device according to the second modification of the first embodiment.

DETAILED DESCRIPTION OF THE PREFERRED EMBODIMENTS

Figure 1:
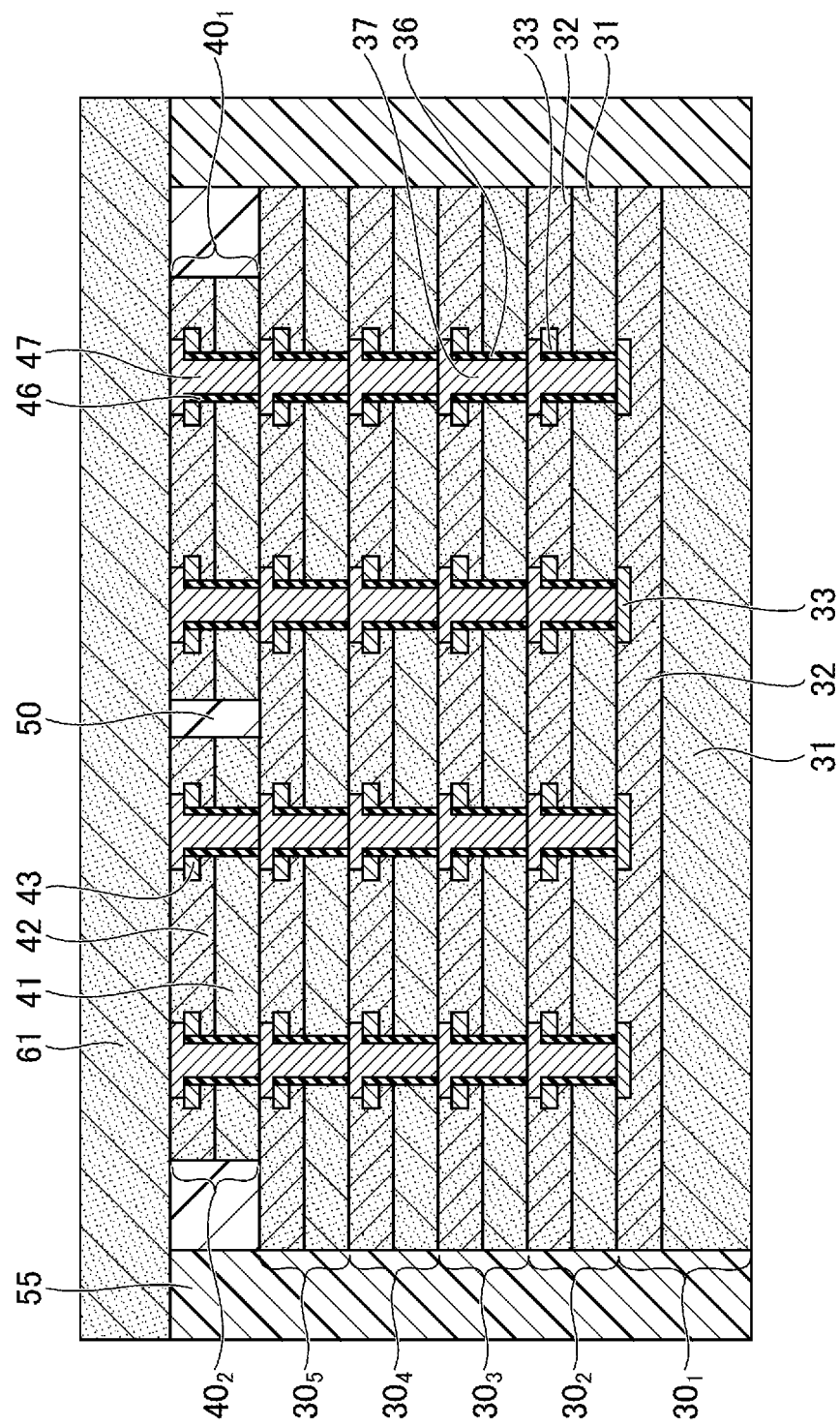
FIG. 1 is a cross-sectional view illustrating a semiconductor device according to an embodiment of the present disclosure.

Hereinafter, an embodiment for carrying out the disclosure with reference to the drawings will be described. In each drawing, the same components are indicated by the same reference numerals and overlapping descriptions may be omitted.

First Embodiment

[Semiconductor Device Structure]

FIG. 1 is a cross-sectional view illustrating a semiconductor device according to a first embodiment. Referring to FIG. 1, the semiconductor device 1 according to the first embodiment includes semiconductor chips $30_1$, $30_2$, $30_3$, $30_4$, and $30_5$, semiconductor chips $40_1$ and $40_2$, a resin layer 50, a substrate 61, and a resin layer 55. In the semiconductor device 1, a stacked portion of the semiconductor chips $30_1$, $30_2$, $30_3$, $30_4$, and $30_5$, and the semiconductor chips $40_1$ and $40_2$ may be referred to as a semiconductor chip stack. In the semiconductor device 1, a back surface of the semiconductor chip $30_5$ that is the lowest layer serves as a heat dissipation face.

In the present application, a plan view means a view of an object as seen in a direction normal to one face of the substrate 61, and a planar shape means a shape of an object as seen in a direction normal to one face of the substrate 61.

The semiconductor chips $30_1$, $30_2$, $30_3$, $30_4$, and $30_5$ are sequentially stacked while facing the electrode pad forming sides in the same direction and have a structure including the semiconductor chips at different layers directly and electrically connected to each other via through electrodes.

The semiconductor chip $30_1$ has a body 31, a semiconductor integrated circuit 32, and electrode pads 33. Each of the semiconductor chips $30_2$, $30_3$, $30_4$, and $30_5$ also has a body 31, a semiconductor integrated circuit 32, electrode pads 33, an insulating layer 36, and a through electrode 37. The thicknesses of each of the semiconductor chips $30_2$, $30_3$, $30_4$, and $30_5$ may be made, for example, about 5 μm to about 15 μm. The thickness of the semiconductor chip $30_1$ can be determined appropriately.

In the semiconductor chips $30_1$ to $30_5$, the body 31 is composed of, for example, silicon, gallium nitride, silicon carbide, or the like. The semiconductor integrated circuit 32 includes a diffusion layer (not illustrated), an insulation layer (not illustrated), a via hole (not illustrated), and an interconnection layer (not illustrated) such as silicon, gallium nitride, silicon carbide, and the like, and is provided on one side of the body 31.

The electrode pads 33 are disposed on the top side of semiconductor integrated circuit 32 via an insulating film (such as a silicon oxide) that is not illustrated. The electrode pads 33 are electrically connected to an interconnection layer (not illustrated) provided in the semiconductor integrated circuit 32. The planar shape of the electrode pad 33 may be, for example, rectangular or circular. When the planar shape of the electrode pad 33 is circular, the diameter of the electrode pad 33 may be, for example, about 5 μm to about 10 μm. The pitch of electrode pad 33 may be made, for example, about 1 μm to 12 μm.

For example, the electrode pad 33 may be a stack formed by stacking an Au layer, an Al layer, a Cu layer, or the like on a Ti layer or a TiN layer. As the electrode pad 33, a stack formed by stacking an Au layer on a Ni layer, a stack formed by sequentially stacking a Pd layer and an Au layer on a Ni layer, and a stack or an interconnection having a damascene structure using a high melting point metal such as Co, Ta, Ti, and TiN instead of Ni, and stacking a Cu layer or an Al layer on the layer, may be used.

In the semiconductor chips $30_2$ to $30_5$, an insulating layer that provides a barrier layer may be provided on the back surface of the body 31. In this case, for example, $SiO_2$, SiON, $Si_3N_4$, or the like may be used as a material of the insulating layer. The thickness of the insulating layer may be, for example, about 0.05 μm to 0.5 μm. In the semiconductor chips $30_1$ to $30_5$, by forming an insulating layer (barrier layer) on the back side of the body 31, the concern of contamination of the semiconductor chip with metal impurities from the back side can be reduced, and when the semiconductor chip is disposed in a lower layer, the semiconductor chip can be isolated from the semiconductor chip of the lower layer.

The upper and lower adjacent semiconductor chips are directly joined without, for example, an adhesive layer or the like, but may be joined to each other via an adhesive layer or the like as necessary (for example, where the surface of the semiconductor integrated circuit 32 is not flat). Each semiconductor chip except for the lowest layer has via holes that penetrate through each semiconductor chip except for the lowest layer and that expose the upper faces of the electrode pads 33 of the semiconductor chip $30_1$ that is a base, and insulating layers 36 are provided on the inner walls (the side wall) of the via holes. For example, $SiO_2$, SiON, $Si_3N_4$, or the like may be used as the material of the insulating layers 36. The thickness of the insulating layers 36 may be, for example, about 0.05 μm to 0.5 μm. The via holes are filled with through electrodes 37 so as to contact the insulating layers 36. In addition, when an insulating layer is previously disposed in the body 31 and the insulating layer is greater than the diameter of the through-electrodes 37, the insulating layers 36 may not be used.

The planar shape of the through-electrode 37 located within the insulating layer 36 may be, for example, circular or polygonal. When the planar shape of the through-electrode 37 located within the insulating layer 36 is circular, the diameter may be, for example, about 0.5 μm to about 5 μm. The planar shape of the through-electrode 37 located on the electrode pad 33 may be, for example, circular or polygonal. When the planar shape of the through-electrode 37 located on the electrode pad 33 is circular, its diameter may be as great as, for example, the diameter of the through-electrode 37 located within the insulating layer 36, or may be greater than the diameter of the through-electrode 37 located within the insulating layer 36 by 0.5 μm to 2 μm. The pitch of the through electrode 37 may be made, for example, about 1 μm to about 12 μm.

The through-electrode 37 is, for example, copper. The through-electrode 37 may have a structure including a plurality of stacked metals. Specifically, for example, the through-electrode 37 may be a stack formed by stacking an Au layer, an Al layer, a Cu layer, and the like on a Ti layer or a TiN layer. As the through-electrode 37, a stack formed by stacking a layer of Au on a Ni layer, a stack formed by sequentially stacking Pd and Au layers on the Ni layer, and a layer or an interconnection having a damascene structure formed by using a high melting point metal such as Co, Ta, Ti, and TiN instead of Ni, and stacking a Cu layer or an Al layer on the same layer may be used.

In this manner, the electrode pads 33 of the respective semiconductor chips are formed on the top face of the electrode pad 33 and are directly and electrically connected to each other via the through-electrodes 37 formed through the insulating layer 36 in the via holes. It should be noted that the electrode pads 33 and the portions formed on the top face of the electrode pads 33 of the through-electrodes 37 may be referred to simply as electrode pads. Also, the electrode pads 33 are connected to transistors included in the semiconductor integrated circuit 32, and it may be possible to be installed without conducting electricity to the transistors and the upper and lower substrates, in particular, when it is preferable that the density of the through-electrodes 37 be uniform for processing of the through-electrodes 37. That is, there may be isolated electrode pads 33 and through-electrodes 37 that are not electrically connected. The presence of isolated electrode pads 33 and through-electrodes 37 can improve heat dissipation.

In the semiconductor chips $30_1$ to $30_5$, whether the electrode pads 33 connected to the transistors are formed can be optionally determined according to the specification. This allows the through-electrode 37 to be connected only to the desired semiconductor chip among the stacked semiconductor chips. For example, the same signal can be passed through the third-layer semiconductor chip to provide the same signal to the fourth-layer semiconductor chip or the second-layer semiconductor chip, or different signals can be provided to the semiconductor chip of each layer.

Semiconductor chips $40_1$ and $40_2$ are aligned on semiconductor chips $30_5$ while facing the electrode pad forming side in the same direction as that of the electrode pad forming side of the semiconductor chips $30_1$, $30_2$, $30_3$, $30_4$, and $30_5$. The semiconductor chips $40_1$ and $40_2$ are disposed at the top layer of the semiconductor chip stack when the electrode pad forming side of each of the semiconductor chips faces upward. Electrode pads 43 of the semiconductor chips $40_1$ and $40_2$ are directly and electrically connected to the electrode pads 33 of the semiconductor chip $30_5$ via through-electrodes 47.

The semiconductor chips $40_1$ and $40_2$ are connected to each other in parallel. For example, a rewiring layer may be formed over semiconductor integrated circuits 42 of the semiconductor chips $40_1$ and $40_2$ via an insulating film, thereby connecting the semiconductor chips 401 and 402 to each other in parallel. Here, a rewiring layer may be formed on the semiconductor integrated circuit 32 of the semiconductor chip $30_5$ via an insulating film, and the semiconductor chip $40_1$ and the semiconductor chip $40_2$ may be connected to each other in parallel by the rewiring layer. In such a case, the electrode pads 43 of the semiconductor chips $40_1$ and $40_2$ are directly and electrically connected to the rewiring layer formed via an insulating film on the semiconductor integrated circuit 32 of the semiconductor chip $30_5$ via the through-electrode 47.

In FIG. 1, the semiconductor chip $40_1$ and the semiconductor chip $40_2$ are connected to each other in parallel, but the semiconductor chips disposed on the semiconductor chip $30_5$ and connected to each other in parallel are not limited to two, but may be three or more.

Each of the semiconductor chips $40_1$ and $40_2$ includes a body 41, a semiconductor integrated circuit 42, electrode pads 43, an insulating layer 46, and a through-electrode 47. The material and thickness of the body 41, the semiconductor integrated circuit 42, the electrode pads 43, the insulating layer 46, and the through-electrode 47 can be similar to, for example, the body 31, the semiconductor integrated circuit 32, the electrode pads 33, the insulating layer 36, and the through-electrode 37. The thickness of each of the semiconductor chips $40_1$ and $40_2$ may be made, for example, about 10 μm to about 15 μm.

The semiconductor chips $40_1$ and $40_2$ are directly attached to the semiconductor chip $30_5$, for example, without adhesive layers or the like, but may be attached via adhesive layers or the like. The semiconductor chips $40_1$ and $40_2$ include via holes that expose the top face of the electrode pads of the semiconductor chip $30_5$, and the insulating layer 46 is provided on the inner walls (sidewalls) of the via holes. For example, $SiO_2$, SiON, $Si_3N_4$, or the like may be used as the material of the insulating layer 46. The thickness of the insulating layer 46 may be, for example, about 0.05 μm to about 0.5 μm. The via hole is filled with the through-electrode 47 so as to contact the insulating layer 46. The semiconductor chips $40_1$ and $40_2$ are directly and electrically connected to the semiconductor chip $30_5$ via the through-electrodes 47. In addition, if an insulating layer is previously disposed in the body 41 and the insulating layer is larger than the diameter of the through-electrodes 47, the insulating layer 46 may not be used.

The planar shape of the through-electrode 47 located within the insulating layer 46 may be, for example, circular or polygonal. When the planar shape of the through electrode 47 located within the insulating layer 46 is circular, the diameter may be, for example, in the range of about 0.5 μm to about 5 μm. The planar shape of the through-electrode 47 located on the electrode pad 43 may be, for example, circular or polygonal. When the planar shape of the through electrode 47 located on the electrode pads 43 is circular, its diameter may be as large as, for example, the diameter of the through-electrode 47 located in the insulating layer 46 or may be greater than the diameter of the through electrode 47 located in the insulating layer 46 by about 1 μm to about 5 μm, for example. The pitch of the through electrode 47 may be made, for example, about 5 μm to about 12 μm. The material of the through electrode 47 may be similar to, for example, that of the through-electrode 37.

The semiconductor chips $30_1$ to $30_4$ are, for example, memory chips. The semiconductor chip $30_5$ is, for example, a controller chip. The semiconductor chips $40_1$ and $40_2$ are logic chips, for example. The logic chip is, for example, a CPU (Central Processing Unit) or a GPU (Graphics Processing Unit). Also, the semiconductor chips $40_1$ and $40_2$ may be connected to a power source noise reduction capacitor or the like. In the semiconductor device 1, five semiconductor chips $30_1$ to $30_5$ are stacked, but are not limited thereto, and any number of semiconductor chips can be stacked. Also, in the semiconductor device 1, two semiconductor chips $40_1$ and $40_2$ are positioned side by side on the semiconductor chip $30_5$, but are not limited thereto, three or more semiconductor chips may be positioned side by side.

A resin layer 50 is provided on the semiconductor chip $30_5$ to coat lateral faces of the semiconductor chips $40_1$ and $40_2$. As the material of the resin layer 50, for example, a thermosetting insulating resin containing benzocyclobutene (BCB) as a principal composition can be used. The resin layer 50 may be made with an epoxy-based resin, an acrylic resin, a thermosetting insulating resin that is a polyimide-based resin, or an insulating composite material with an added solid fine powder, such as silica.

Also, a resin layer 55 is provided that coats the lateral faces of the semiconductor chips $30_1$ to $30_5$ and lateral faces of the resin layer 50. The material of the resin layer 55 may be similar to, for example, that of the resin layer 50.

The substrate 61 is fixed to the top faces of the semiconductor chips $40_1$ and $40_2$, the resin layer 50, and the resin layer 55. The substrate 61 is, for example, silicon, but may be made with germanium, sapphire, glass, or the like. The thickness of the substrate 61 may be optional. The substrate 61 can be fixed to the top faces of the semiconductor chips $40_1$ and $40_2$, the resin layer 50, and the resin layer 55, for example, via an adhesive layer, which is not illustrated. For example, a thermosetting insulating resin having the main composition of benzocyclobutene (for example, divinylsiloxane-bis-benzocyclobutene: DVS-BCB) may be used as the material of the adhesive layer. The adhesive layer may be made with an epoxy resin, an acrylic resin, a thermosetting insulating resin that is a polyimide resin, or an insulating composite material with an added solid fine powder such as silica. A material containing silicon, such as siloxane, may be used as the material of the adhesive layer. The thickness of the adhesive layer may be, for example, about 1 μm.

[Semiconductor Device Manufacturing Steps]

Next, manufacturing steps of the semiconductor device according to the first embodiment will be described. FIGS. 2 to 21 are diagrams illustrating the manufacturing steps of the semiconductor device according to the first embodiment.

Figure 2:
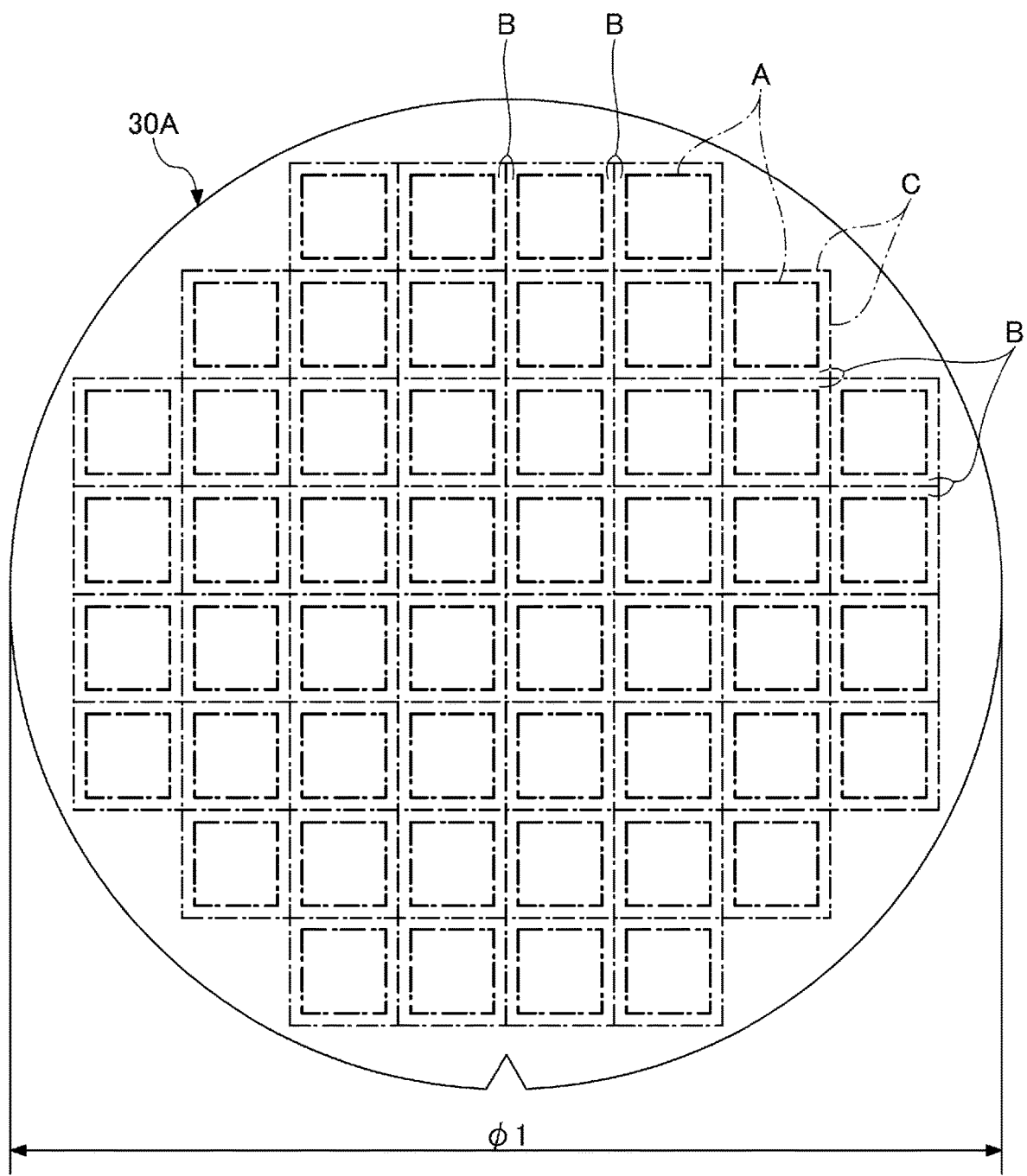
FIG. 2 is a first diagram illustrating a manufacturing process of a semiconductor device according to a first embodiment.

First, in steps illustrated in FIGS. 2 and 3, a non-thinned substrate 30A is prepared. FIG. 2 is a plan view, and FIG. 3 is a cross-sectional view. In the substrate 30A, a plurality of product regions A and a scribe region B that separates each product region A are defined. The product regions A, for example, are arranged vertically and horizontally. The reference C in the scribe region B represents a position where a dicing blade or the like cuts the substrate 30A (hereinafter referred to as the "cutting position C"). Each product region A of the substrate 30A is cut into a semiconductor chip $30_1$. The substrate 30A includes a body 31, a semiconductor integrated circuit 32, and electrode pads 33 as described with reference to FIG. 1 (see FIG. 8), but the electrode pads 33 are not illustrated here.

Here, for example, the material of the substrate 30A is a silicon wafer. The substrate 30A may be, for example, circular, and the diameter φ1 may be, for example, 6 inches (about 150 mm), 8 inches (about 200 mm), 12 inches (about 300 mm) or the like. The thickness of the substrate 30A is, for example, 0.625 mm (if φ1=6 inches), 0.725 mm (if φ1=8 inches), 0.775 mm (if φ1=12 inches), or the like. The following FIGS. 8 to 18 are described with reference to a cross-section of the product region A illustrated in FIGS. 2 and 3.

Next, in a step illustrated in FIG. 4, a substrate 30B having the same structure as that of the substrate 30A is prepared and a substrate 510 is joined to the electrode pad forming side of the substrate 30B via an adhesive layer 520. The substrate 510 preferably allows light to pass therethrough during alignment, and for example, a substrate of quartz glass may be used as the substrate 510. The adhesive layer 520 can be, for example, an adhesive that softens at a temperature that is heated in the step illustrated in FIG. 7, which will be described below (an adhesive that softens at about 200° C. or less). The adhesive layer 520 can be formed on one face of the substrate 510, for example, by a spin-coating method. The adhesive layer 520 may be formed on one face of the substrate 510 by a method of attaching a film-like adhesive or the like instead of using a spin-coating method.

Next, in a process illustrated in FIG. 5, a part of the back side of the substrate 30B is ground with a grinder or the like, and the back side of the substrate 30B is thinned. An insulating layer may be formed on the back side of the thinned substrate 30B by a plasma CVD method or the like. The thickness of the thinned substrate 30B may be, for example, about 5 µm to 15 µm. By increasing the thickness of the substrate 30B to about 5 µm to about 15 µm, the processing time of via holes is greatly reduced, and the aspect ratio is reduced by thinning, thereby improving filling properties and coverage.

Next, in a step illustrated in FIG. 6, the substrate 30B joined to the substrate 510 is stacked on the substrate 30A while facing the back side of the substrate 30B to the electrode pad forming side of the substrate 30A. The substrate 30A and the substrate 30B can be joined together using, for example, surface activated bonding (SAB) when the substrate 30A is flat, or a thermosetting resin when the surface of the substrate 30A has irregularities. The thermosetting resin may vary in thickness according to the irregularities (step differences), and for example, a thermosetting resin of 2 to 5 µm may be used for a step difference of 1 µm.

Next, in a step illustrated in FIG. 7, the substrate 510 and the adhesive layer 520 illustrated in FIG. 6 are removed. As described above, an adhesive that softens at a temperature that is heated in the process illustrated in FIG. 4 (an adhesive that softens at about 200° C. or less) is preferably used as the adhesive layer 520. This creates a stack of the substrate 30B and the substrate 30A as magnified in FIG. 8.

Next, in a step illustrated in FIG. 9, a via hole 30$x$ is formed. The via hole 30$x$ penetrates through the electrode pads 33, the semiconductor integrated circuit 32, and the body 31 of the substrate 30B and is formed to expose the surface of the electrode pads 33 of the substrate 30A. The via hole 30$x$ can be formed, for example, by dry etching. The via hole 30$x$ may be, for example, circular in a plan view with a diameter of, for example, about 0.5 µm to about 5 µm.

Figure 10:
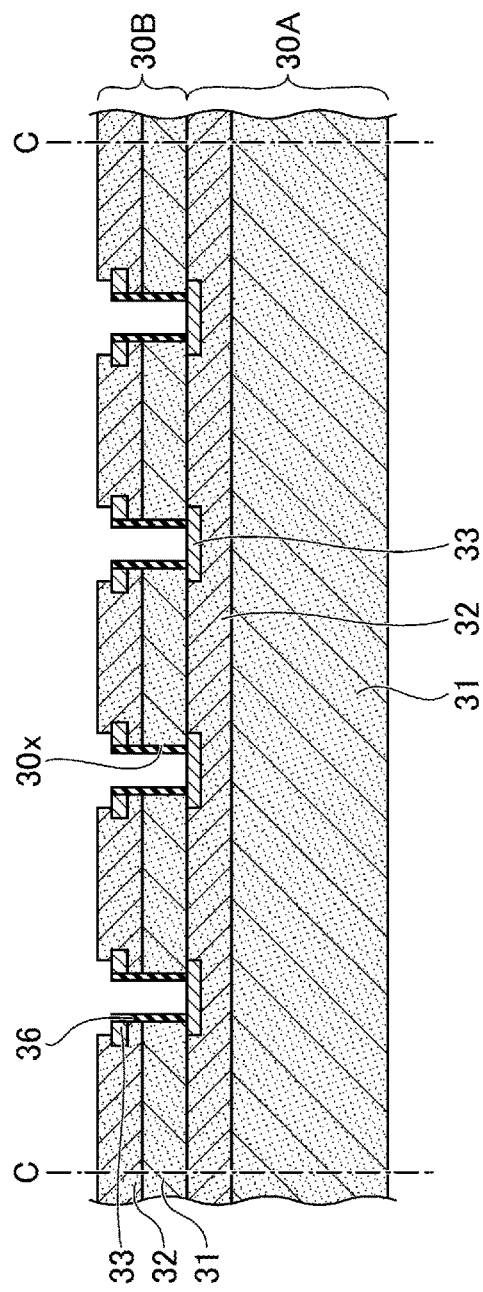
FIG. 10 is a ninth diagram illustrating a manufacturing process of a semiconductor device according to the first embodiment.

Next, in a step illustrated in FIG. 10, an insulating layer 36 is formed that coats the inner wall surface of the via hole 30$x$. The insulating layer 36 can be formed, for example, by forming an insulating layer that continuously coats an inner wall surface of the via hole 30$x$ and the top surface of the electrode pad 33 exposed in the via hole 30$x$ by plasma CVD or the like, and by removing a portion except for the portion that coats the inner wall surface of the via hole 30$x$ by RIE (Reactive Ion Etching) or the like. In addition, when an insulating layer is previously disposed in the body 31 and when the insulating layer is larger than the diameter of the through-electrode 37, the insulating layer 36 may not be used.

Figure 11:
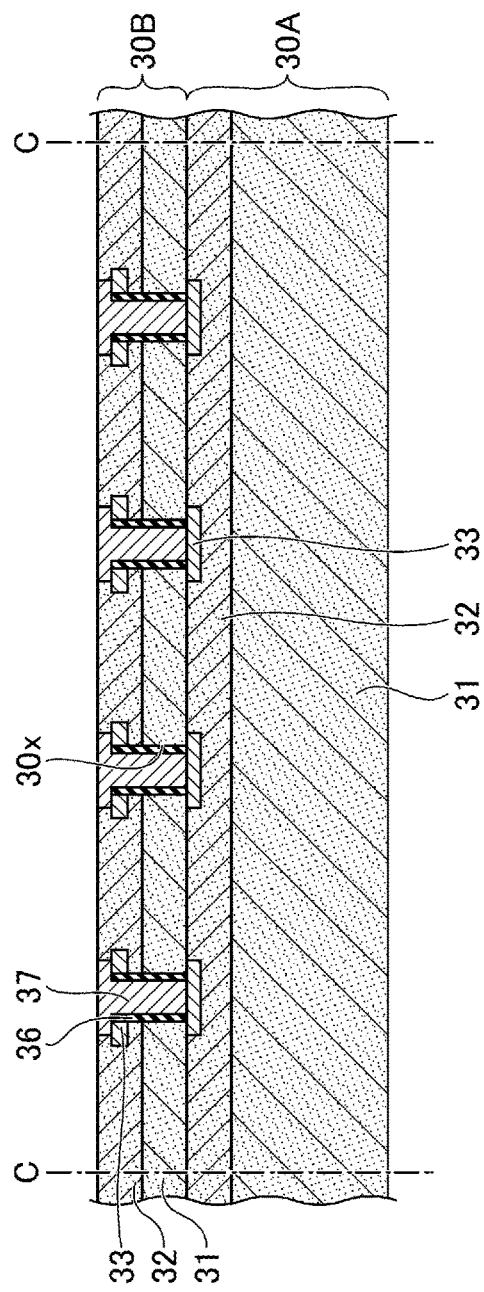
FIG. 11 is a tenth diagram illustrating a manufacturing process of a semiconductor device according to the first embodiment.

Next, in a step illustrated in FIG. 11, a through-electrodes 37 are formed in the via holes 30$x$. The through-electrodes 37 may be formed in the via holes 30$x$, for example, by a combination of sputtering and plating methods. Specifically, for example, a power supply layer is formed by depositing metals such as Cu by a sputtering method in the range of about 200 nm to about 500 nm so as to continuously coat the inner wall surfaces of the via holes 30$x$ and the top faces of the electrode pads 33 exposed in the via holes 30$x$. The via holes 30$x$ are filled with a metal such as Cu by an electrolytic plating method that supplies electrical power through power supply layers, and electrolytic plating layers protruding from the top faces of the body 31 are formed. Then, the electrolytic plating layers protruding from the top faces of the body 31 are removed by CMP or the like. The top faces of the electrolytic plating layers filling the via holes 30$x$ and the top face of the body 31 may be, for example, flat. Thus, it is possible to form through-electrodes 37 on which electrolyte plating layers are stacked on the power supply layers.

Figure 12:
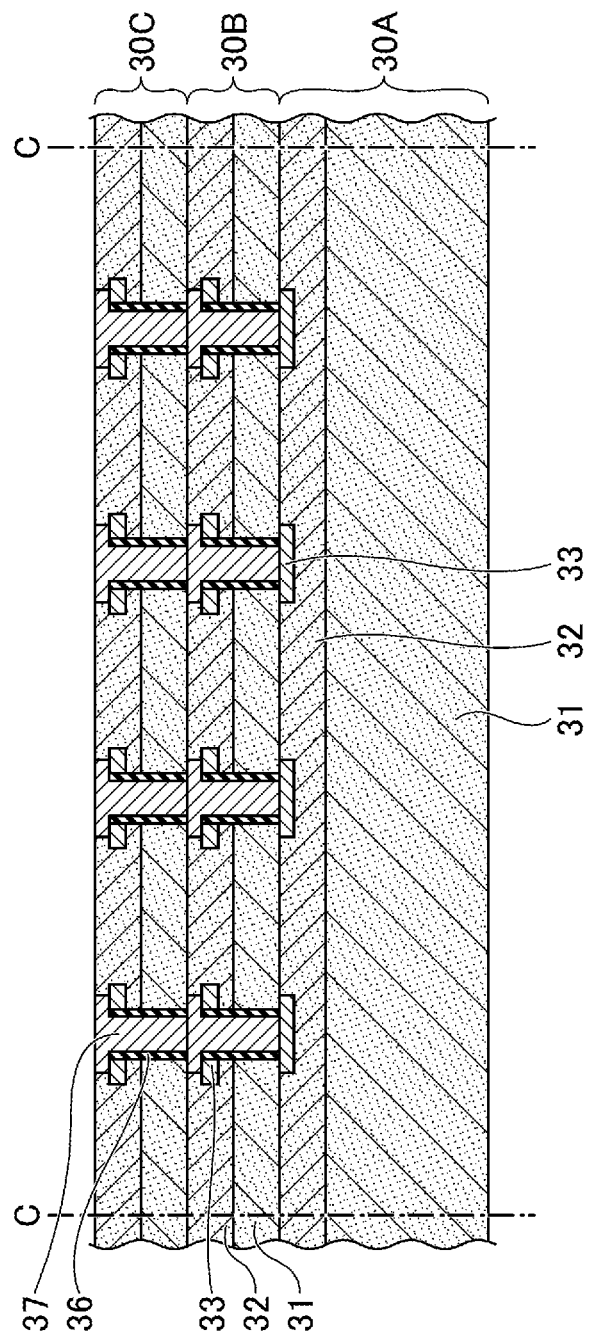
FIG. 12 is an eleventh diagram illustrating a manufacturing process of a semiconductor device according to the first embodiment.

Next, in a step illustrated in FIG. 12, a substrate 30C is stacked on the substrate 30B by the same steps as those in FIGS. 2 to 8. Via holes 30$x$ and through-electrodes 37 are then formed in the substrate 30C by the same steps as those in FIGS. 9 to 11. Electrode pads 33 of the substrate 30C are electrically connected to the through-electrodes 37 of the substrate 30B via the through-electrodes 37 of the substrate 30C.

Figure 13:
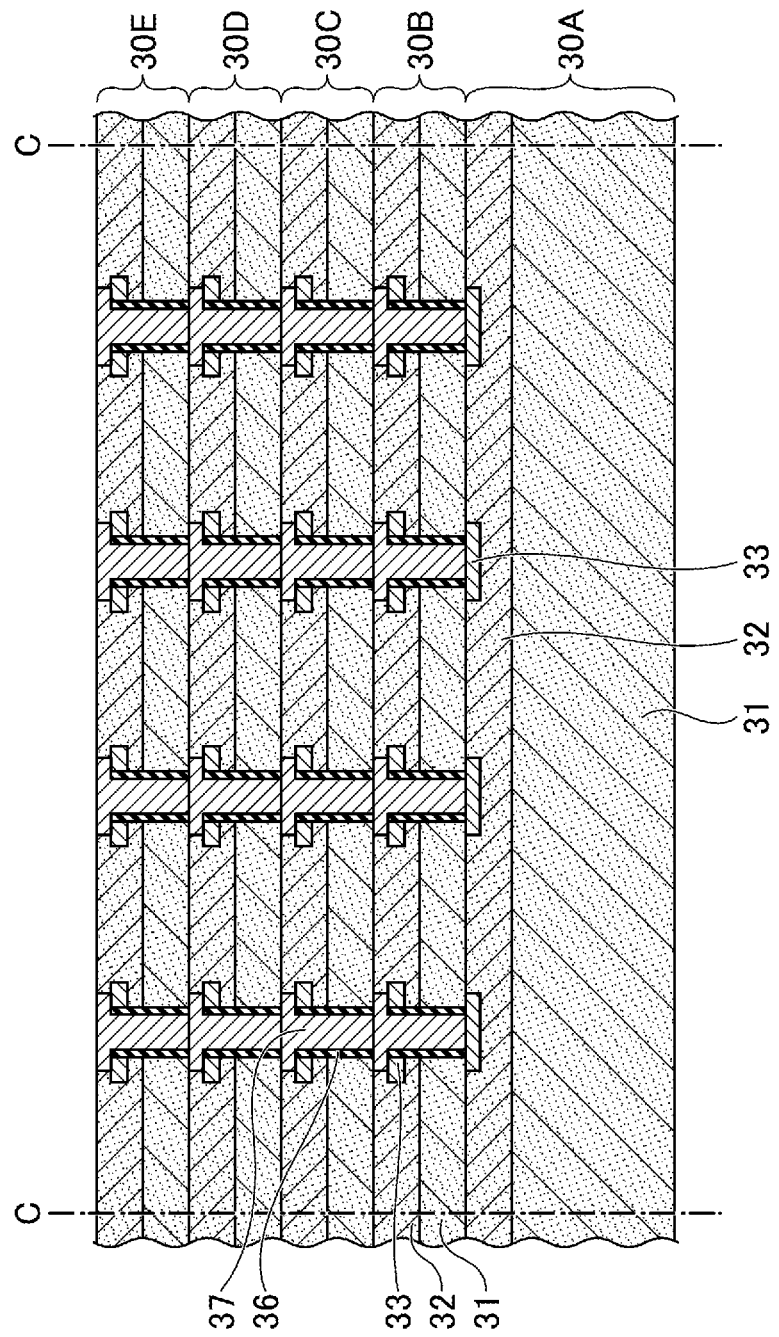
FIG. 13 is a twelfth diagram illustrating a manufacturing process of a semiconductor device according to the first embodiment.

Next, in a step illustrated in FIG. 13, a substrate 30D is stacked on the substrate 30C in the same manner as that in FIG. 12 to form via holes 30$x$ and through-electrodes 37 on the substrate 30D. Electrode pads 33 of the substrate 30D are then electrically connected to the through-electrodes 37 of the substrate 30C via the through-electrodes 37 of the substrate 30D. In addition, a substrate 30E is stacked on the substrate 30D to form via holes 30$x$ and through-electrodes 37 in the substrate 30E. Electrode pads 33 of the substrate 30E are then electrically connected to the through-electrodes 37 of the substrate 30D via the through-electrodes 37 of the substrate 30E. Thus, the substrates 30A to 30E including a plurality of defined product regions of the semiconductor chips are stacked while facing the electrode pad forming sides in the same direction, and a structure including different layers of substrates directly and electrically connected to each other via the through-electrode 37 is manufactured.

Figure 14:
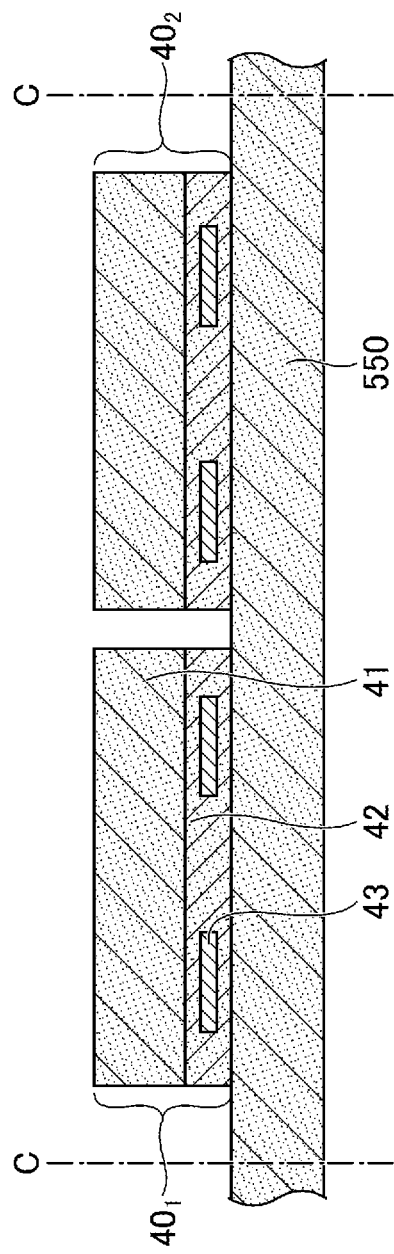
FIG. 14 is a thirteenth diagram illustrating a manufacturing process of a semiconductor device according to the first embodiment.

Next, in a step illustrated in FIG. 14, separated semiconductor chips 40$_1$ and 40$_2$ and a substrate 550 are prepared. The substrate 550 has, for example, the same size as that of the substrate 30A. The substrate 550 is, for example, silicon, but may be made with germanium, sapphire, glass, or the like. Similar to the substrate 30A, the substrate 550 includes a plurality of product regions A and a scribe region B separating each product region A that are defined therein. The semiconductor chips 40$_1$ and 40$_2$ are then attached to each of the product regions A on one side of the substrate 550 while facing the electrode pad forming sides toward the substrate 550 (that is, in a face-down state). The substrate 550 and the semiconductor chips 40$_1$ and 40$_2$ can be joined together, for example, via an adhesive layer. The material of the adhesive layer and the like are the same as those described with reference to FIG. 4.

Figure 15:
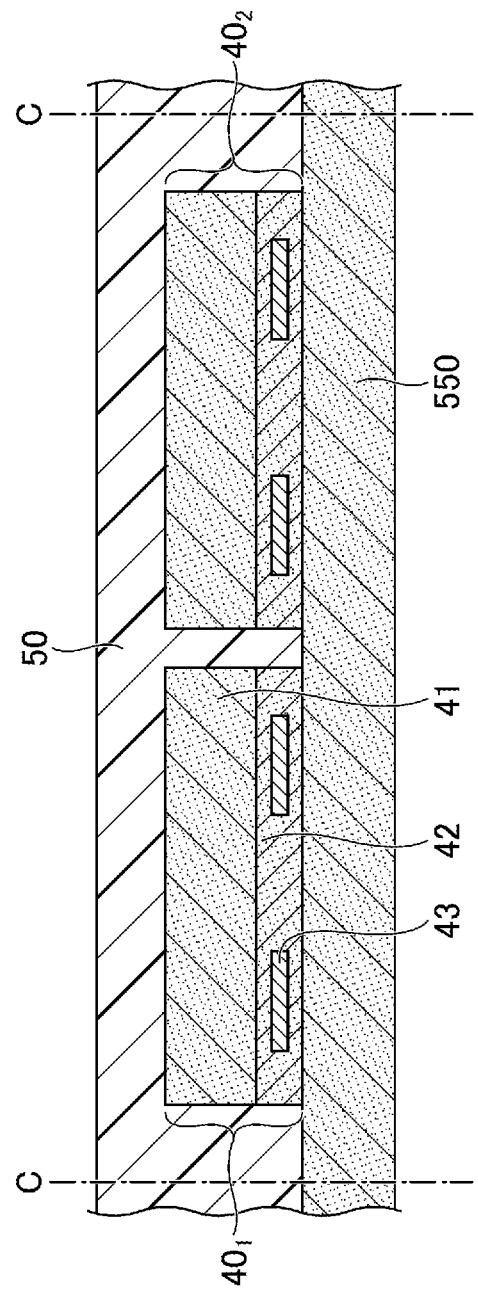
FIG. 15 is a fourteenth diagram illustrating a manufacturing process of a semiconductor device according to the first embodiment.

Next, in a process illustrated in FIG. 15, a resin layer 50 to coat at least lateral faces of the semiconductor chips 40$_1$ and 40$_2$ attached to each product region A is formed on one face of the substrate 550. In this step, it is sufficient for the lateral faces of the semiconductor chips 40$_1$ and 40$_2$ to be sealed until the lateral faces of the semiconductor chips stack 40$_1$ and 40$_2$ are completely sealed by the resin layer 50 after the semiconductor chips 40$_1$ and 40$_2$ are thinned in the step illustrated in FIG. 16, which will be described later. However, the resin layer 50 may be formed to coat the lateral and back faces of both the semiconductor chips 40$_1$ and 40$_2$.

The material of the resin layer 50 and the like are as described above. The resin layer 50 may be formed, for example, by heating and curing the substrate 550 at a predetermined curing temperature after applying a thermosetting insulating resin, for example, by a spin-coating method, or after squeegeeing. The resin layer 50 may be formed using a vapor phase deposition method instead of the spin-coating method or may be formed using a film-like resin attaching method.

Figure 16:
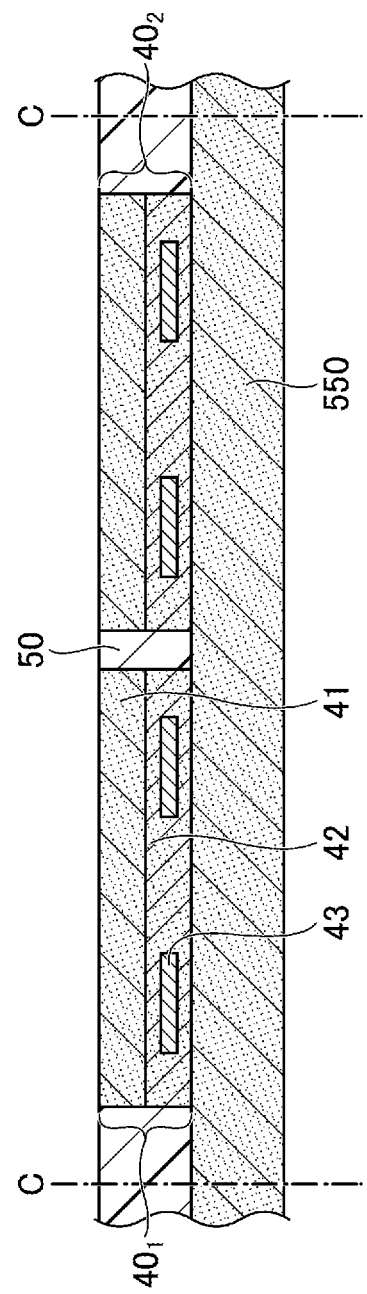
FIG. 16 is a fifteenth diagram illustrating a manufacturing process of a semiconductor device according to the first embodiment.

Next, in a step illustrated in FIG. 16, the unwanted portion of the resin layer 50 and the back side of each of the semiconductor chips 40$_1$ and 40$_2$ attached to each product area A is ground with a grinder or the like to thin the back side of the semiconductor chips 40$_1$ and 40$_2$ attached to each product area A. Thus, the semiconductor chips 40$_1$ and 40$_2$ are thinned and the lateral faces of the semiconductor chips 40$_1$ and 40$_2$ after thinning are sealed with the resin layer 50. In this case, dry polishing or wet etching may be used together. The thickness of the thinned semiconductor chips $40_1$ and $40_2$ may be, for example, in the range of 5 µm to 15 µm. An insulating layer is preferably formed on the back side of the thinned semiconductor chips $40_1$ and $40_2$ by plasma CVD or the like.

Figure 17:
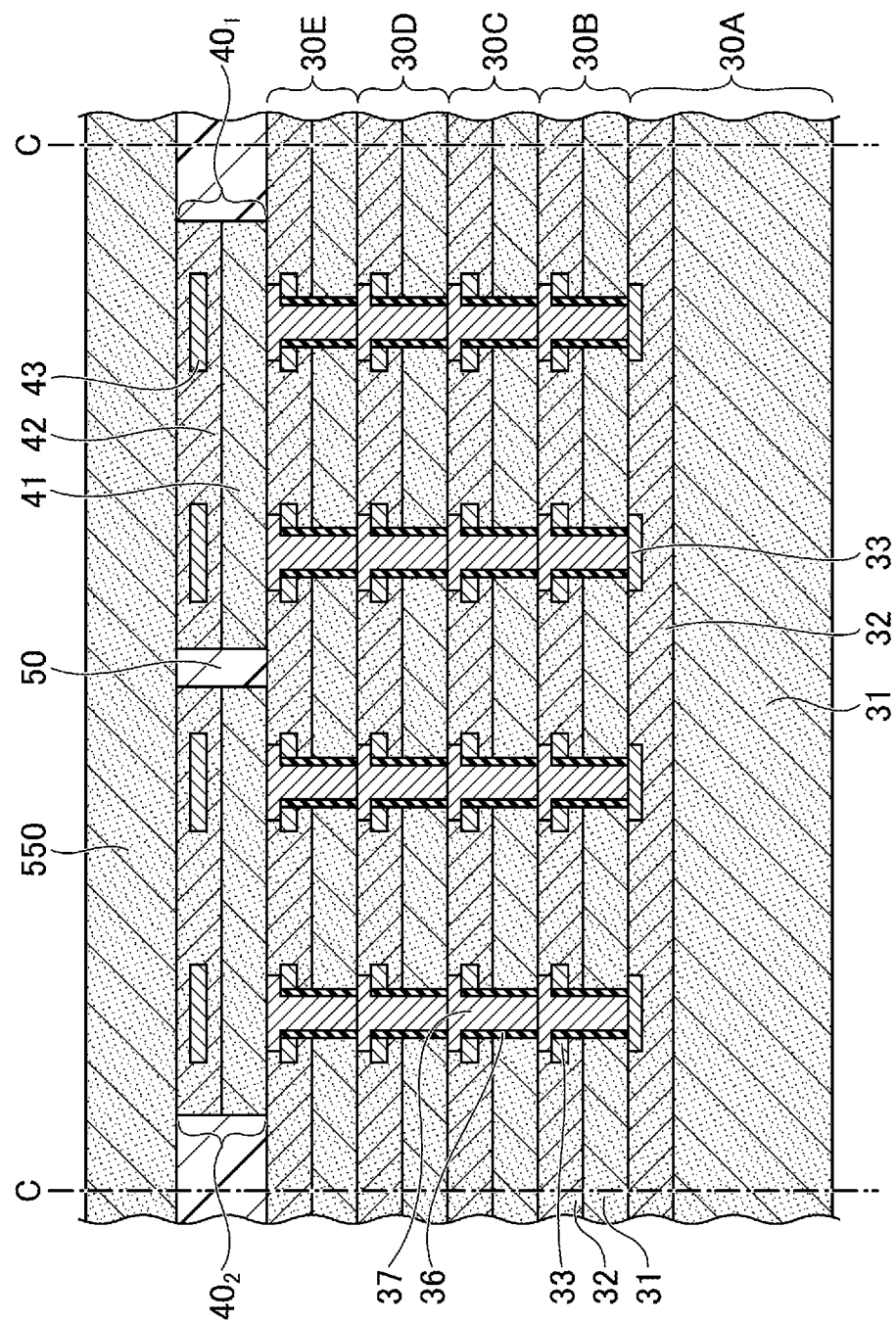
FIG. 17 is a sixteenth diagram illustrating a manufacturing process of a semiconductor device according to the first embodiment.

Next, in a step illustrated in FIG. 17, the semiconductor chips $40_1$ and $40_2$ attached to the substrate 550 are stacked on the electrode pad forming side of the substrate 30E at the top layer, while facing the electrode pad forming sides in the same direction. The substrate 30E and the semiconductor chips $40_1$ and $40_2$ can be joined using, for example, the joining method described above. After the semiconductor chips $40_1$ and $40_2$ are stacked on the substrate 30E, the substrate 550 is removed.

Figure 18:
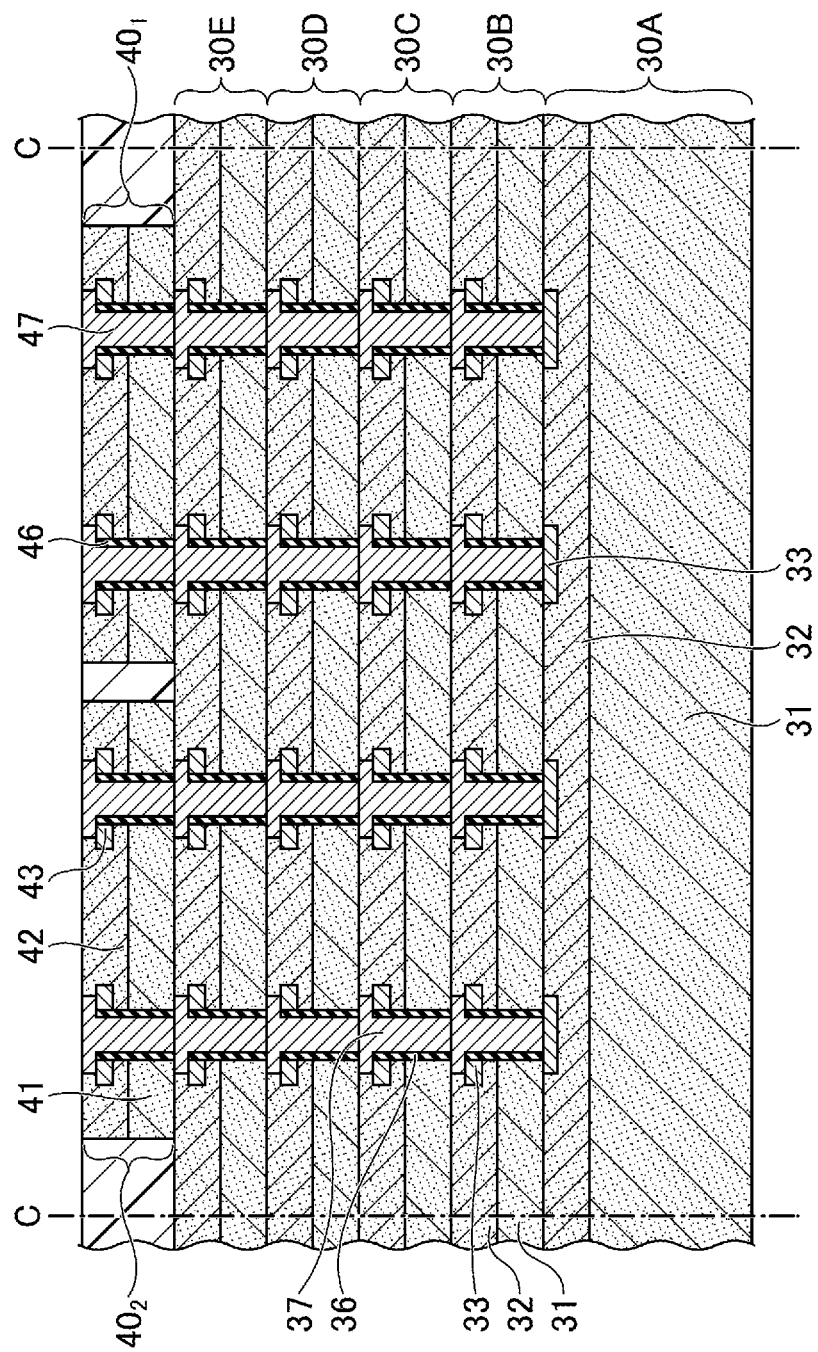
FIG. 18 is a seventeenth diagram illustrating a manufacturing process of a semiconductor device according to the first embodiment.

Next, in a step illustrated in FIG. 18, through-electrodes 47 are formed in the semiconductor chips $40_1$ and $40_2$. Specifically, similar to the step illustrated in FIG. 9, via holes are formed that penetrate through electrode pads 43, a semiconductor integrated circuit 42, and a body 41 of the semiconductor chips $40_1$ and $40_2$ so as to expose the surface of the through-electrodes 37 of the substrate 30E. The via hole may be, for example, circular in a plan view with a diameter of, for example, from about 0.5 µm to about 5 µm. Then, following the same step as illustrated in FIG. 10, an insulating layer 46 that coats the inner wall surface of the via hole is formed, and a through-electrode 47 is formed in the via hole in the same manner as illustrated in FIG. 11. Thus, the electrode pads 43 of the semiconductor chips $40_1$ and $40_2$ are directly and electrically connected to the electrode pads 33 of the substrate 30E via the through-electrodes 47.

Moreover, a rewiring layer (not illustrated) is formed on semiconductor integrated circuits 42 of the semiconductor chips $40_1$ and $40_2$ to connect semiconductor chips $40_1$ and $40_2$ to each other in parallel. The rewiring layer can be formed by, for example, a combination of a sputtering method and a plating method using copper or the like, similar to forming the through-electrode 47. In the step of FIG. 13, the rewiring layer may be formed on the semiconductor integrated circuits 32 of the substrate 30E. In such a case, the electrode pads 43 of the semiconductor chips $40_1$ and $40_2$ are directly and electrically connected to the rewiring layer formed on the semiconductor integrated circuits 32 of the substrate 30E via the through-electrodes 47.

Figure 19:
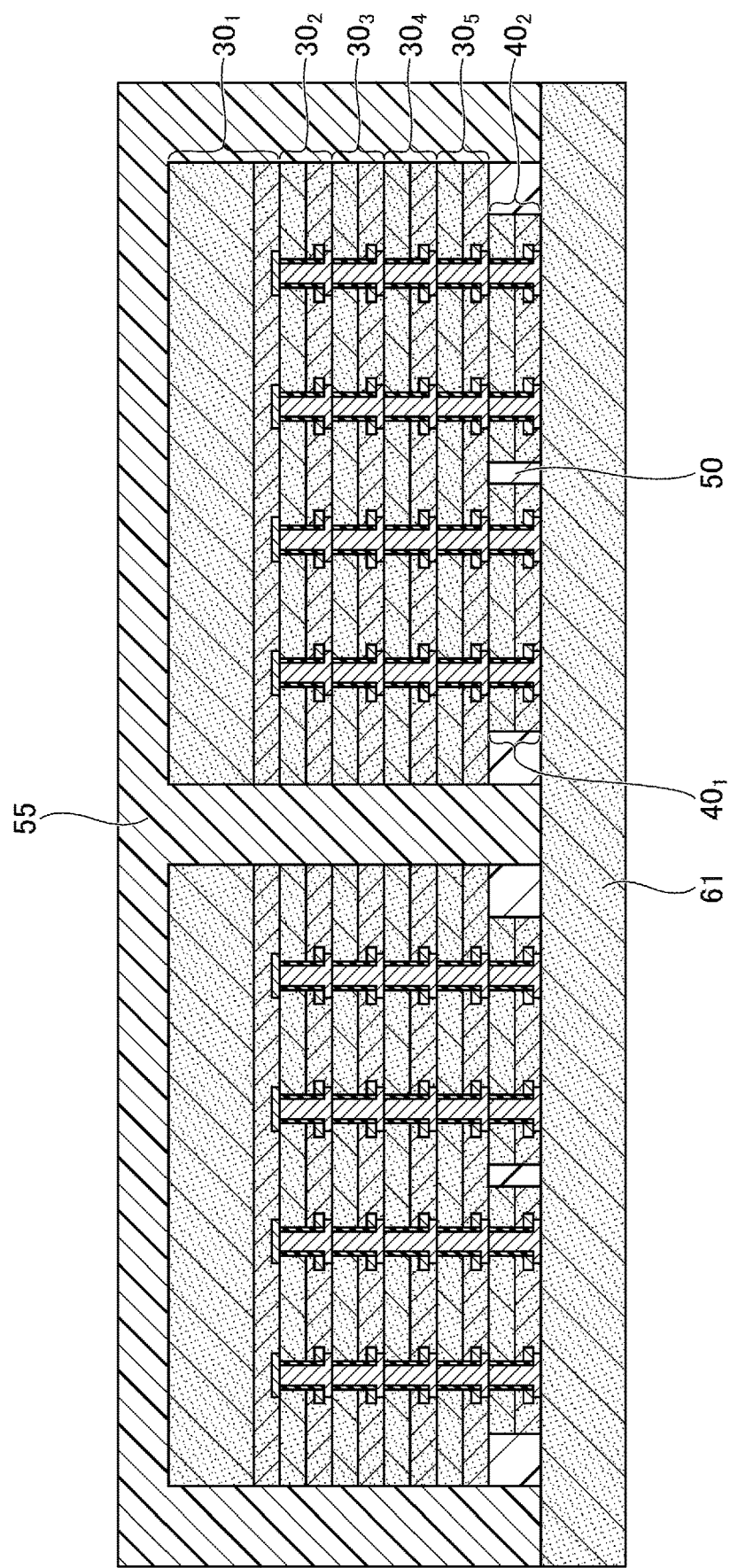
FIG. 19 is an eighteenth diagram illustrating a manufacturing process of a semiconductor device according to the first embodiment.

Next, in a step illustrated in FIG. 19, the structure illustrated in FIG. 18 is cut at the cutting position C to separate each product region and to produce a plurality of semiconductor chip stacks having more semiconductor chips disposed on the top layer than on the other layers. Then, a plurality of semiconductor chip stacks is attached to one face of the substrate 61 while facing the electrode pad forming side toward the substrate 61. For example, the substrate 61 is a silicon wafer in the present embodiment. The thickness of the substrate 61 may be, for example, about 0.5 mm to about 1.0 mm. The substrate 61 and the semiconductor chip stack can be joined, for example, via an adhesive layer. The material of the adhesive layer is as described above.

Then, on one side of the substrate 61, a resin layer 55 is formed that coats at least lateral faces of the semiconductor chip stack. In this step, after the semiconductor chip stack is thinned in the step illustrated in FIG. 20 below, it is sufficient for the lateral faces of the semiconductor chip stack to be sealed until the lateral faces of the semiconductor chip stack are completely sealed with the resin layer 55. However, the resin layer 55 may be formed to coat the lateral and back faces of the semiconductor chip stack. The material and forming method of the resin layer 55 are substantially the same as, for example, the material and forming method of the resin layer 50.

Figure 20:
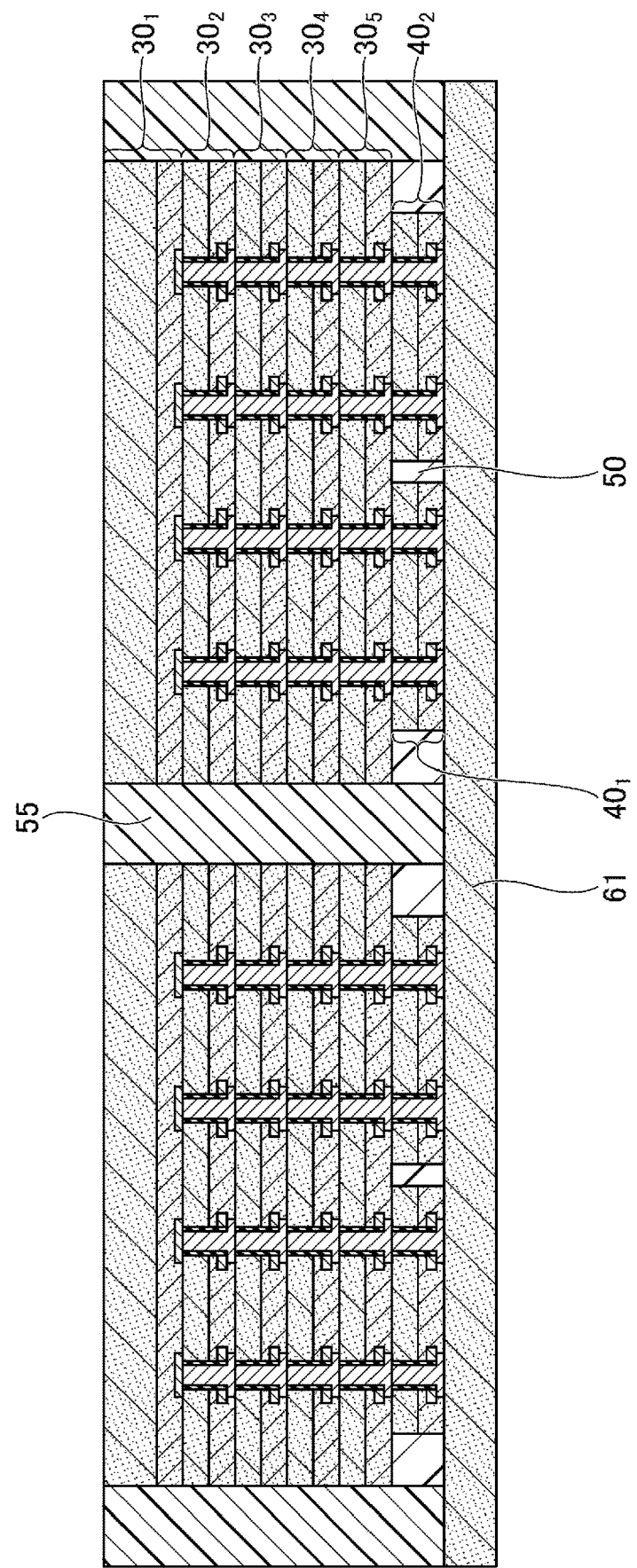
FIG. 20 is a nineteenth diagram illustrating a manufacturing process of a semiconductor device according to the first embodiment.

Next, in a step illustrated in FIG. 20, the unwanted portion of the resin layer 55 and the back side of the semiconductor chip stack are ground with a grinder or the like to thin the back side of the semiconductor chip stack. Thus, the semiconductor chip stack is thinned and the lateral faces of the thinned semiconductor chip stack are sealed with the resin layer 55. In this case, dry polishing or wet etching may be used together.

Figure 21:
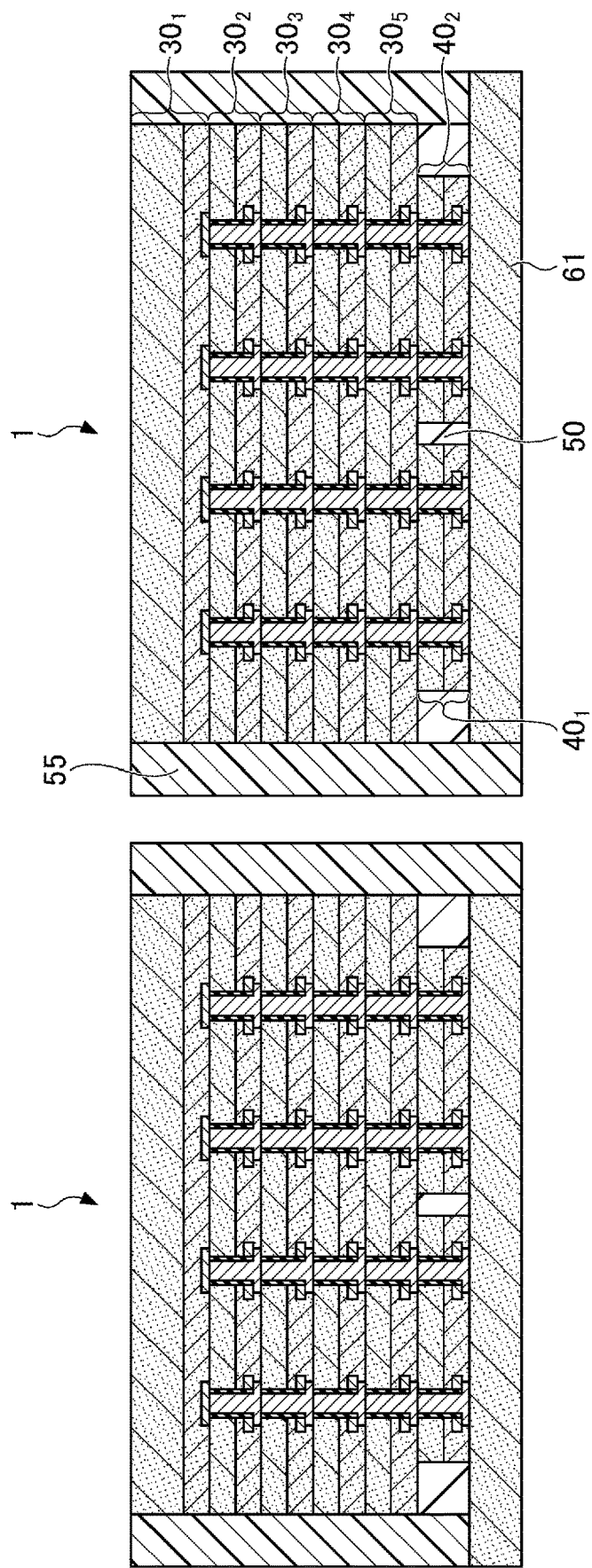
FIG. 21 is a twentieth diagram illustrating a manufacturing process of a semiconductor device according to the first embodiment.

Next, in a step illustrated in FIG. 21, the structure illustrated in FIG. 20 is divided into each semiconductor chip stack. The cuts are made at the location of the resin layer 55 that coats lateral faces of the adjacent semiconductor chip stacks. This produces a plurality of semiconductor devices 1.

Figure 22:
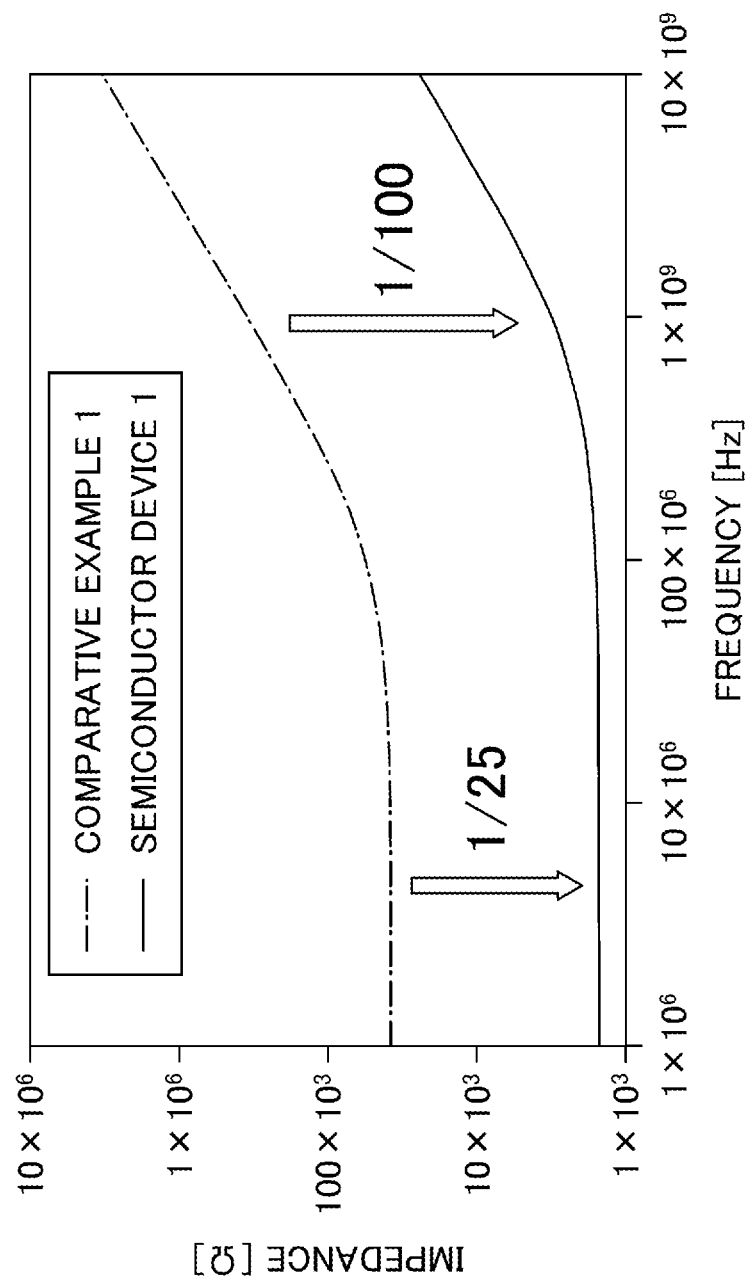
FIG. 22 is a diagram illustrating a first simulation result of the semiconductor device according to the first embodiment.

FIG. 22 is a first diagram showing a simulation result of a semiconductor device according to the first embodiment. In FIG. 22, Comparative Example 1 is a semiconductor device in which through-electrodes of semiconductor chips adjacent in the vertical direction of the semiconductor device 1 are connected to each other via a microbump. Incidentally, in the semiconductor device 1, the diameter of the through-electrode (TSV) excluding the electrode pad portion is made 4 µm, and the length of the through-electrode per layer including the electrode pad portion is made 10 µm. Further, in the semiconductor device according to Comparative Example 1, the diameter of the through-electrode (TSV) excluding the electrode pad portion is made 8 µm; the length of the through-electrode per 18 layers including the electrode pad portion is made 55 µm; and the length of the microbump connecting the through-electrodes is made 26 µm.

From FIG. 22, in the semiconductor device 1, the impedance is about ½5 at the low frequency of 10 MHz or less, and about ¹⁄₁₀₀ at the high frequency of 1 GHz or more compared to the semiconductor device of Comparative Example 1. As described above, the impedance can be significantly reduced by directly connecting through-electrodes without using microbumps between semiconductor chips that were previously electrically connected using microbumps. In the semiconductor device 1, when the impedance decreases, high-speed operation is possible, and the bit width of the data bus is widened. Therefore, broadening of the bandwidth is possible.

Figure 23:
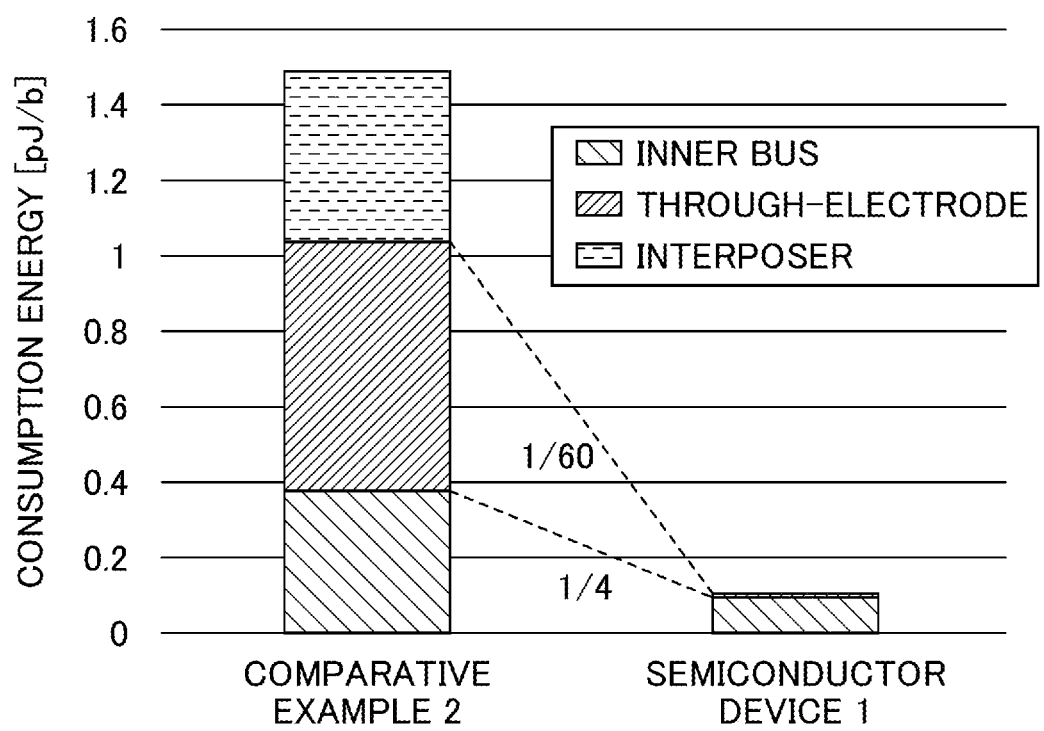
FIG. 23 is a diagram illustrating a second simulation result of the semiconductor device according to the first embodiment.

FIG. 23 is a second diagram showing a simulation result of a semiconductor device according to the first embodiment. In FIG. 23, Comparative Example 2 is a semiconductor device in which a semiconductor chip stack corresponding to the semiconductor chips $30_1$ to $30_5$ and a semiconductor chip corresponding to the semiconductor chips $40_1$ and $40_2$ are placed side by side on a silicon interposer and are electrically connected to each other via a microbump and an interconnection of a silicon interposer. The diameter and length of the through-electrode and the size of the microbump are the same as those in FIG. 22.

From FIG. 23, in the semiconductor device 1, the energy consumption of the through-electrode is about ¹⁄₆₀ and the energy consumption of the internal bus is about ¼ compared to the semiconductor layer according to Comparative Example 2. As described above, by directly connecting through-electrodes without using microbumps between semiconductor chips that were previously electrically connected using microbumps, the energy consumption of the through-electrodes can be greatly reduced.

Incidentally, in the semiconductor device 1, the semiconductor chips $30_1$ to $30_5$ are directly connected to the semiconductor chips $40_1$ and $40_2$, so that an interposer is not required. An internal bus means the power consumption of the connection between the semiconductor chips $30_1$ to $30_5$ and the semiconductor chips $40_1$ and $40_2$ is connected via a vertical interconnection. In Comparative Example 2, the signal between the semiconductor chips $30_1$ to $30_5$ and the semiconductor chips $40_1$ and $40_2$ is exchanged via an interposer.

Meanwhile, the number of internal transistors of logic chips (for example, semiconductor chips $40_1$ and $40_2$) has increased year by year due to miniaturization, reaching $10^{10}/cm^2$ in recent years. However, as the number of internal transistors increases due to miniaturization, the number of internal transistors increases. Therefore, the increase in the number of internal transistors due to miniaturization causes the decrease in the yield of the logic chip.

In the semiconductor device 1, the number of internal transistors can be reduced to divide the logic chips into a plurality of logic chips and connect the plurality of logic chips to each other in parallel. For example, it is possible to reduce the number of internal transistors, to divide a conventional logic chip into two logic chips, which are the semiconductor chips $40_1$ and $40_2$, and to connect the two logic chips to each other in parallel. Alternatively, the number of internal transistors may be further reduced to three or more, and the logic chips may be connected to each other in parallel.

By reducing the number of internal transistors in an individual logic chip, the size of the chip can be reduced and a decrease in yield rate caused by miniaturization can be inhibited, thereby improving the yield rate of individual logic chips. Further, even if a certain degree of defective products are generated in individual logic chips, in the manufacturing method of the semiconductor device 1, the yield rate of the semiconductor device 1 can be improved by inspecting the quality of individual logic chips and by stacking only acceptable logic chips on other semiconductor chips. That is, manufacturing highly reliable semiconductor devices at low cost can be achieved.

Because the high-density connection between the semiconductor chips $30_1$ to $30_5$ and the semiconductor chips $30_1$ to $30_5$ and the semiconductor chips $40_1$ and $40_2$ can be performed by vertical interconnection, for example, the same bandwidth can be obtained even when the frequency is reduced proportionally to a degree of parallelism by performing parallel interconnection. Generally, because the power consumption of a semiconductor can be expressed as frequency×(voltage)²×electrical capacity, the power consumption can be reduced by reducing the frequency or the voltage.

In the semiconductor device 1, because the high density TSV (through-interconnection) can be optimally disposed on the chip surface, the power supply can be performed at the shortest distance in the device, and even if the supply voltage is lowered, the power loss is unlikely to occur. Therefore, as described above, the frequency can be reduced, and by decreasing the voltage, a frequency reduction ratio can be reduced by the first power to the frequency reduction ratio and the voltage reduction ratio can be reduced by the second power to the power consumption.

First Modification of First Embodiment

A first modification of the first embodiment illustrates an example of a semiconductor device in which the stacking positions of semiconductor chips $40_1$ and $40_2$ are different from those of the first embodiment. In the first modification of the first embodiment, the description of the same component as that of the first embodiment described above may be omitted.

Figure 24:
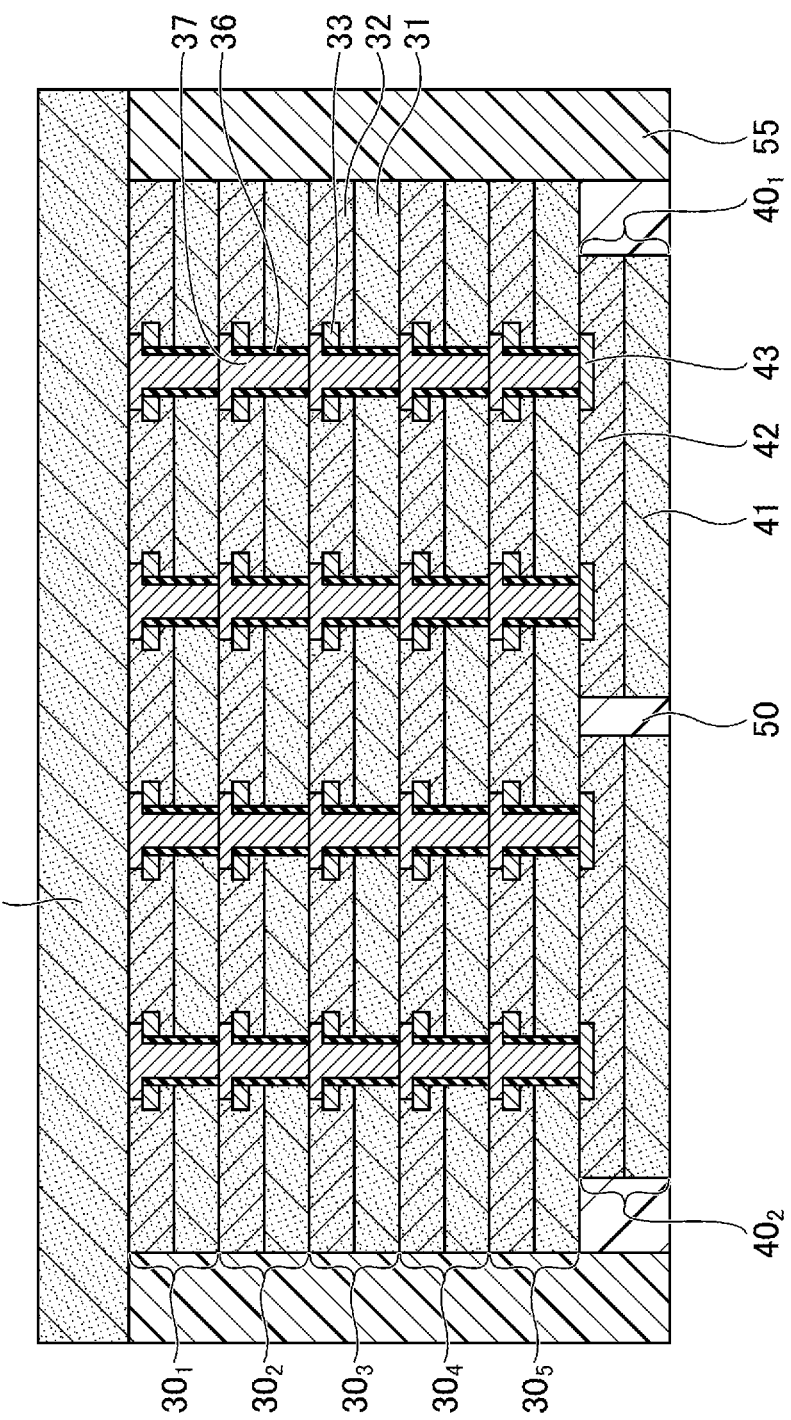
FIG. 24 is a cross-sectional view illustrating a semiconductor device according to a first modification of the first embodiment.

FIG. 24 is a cross-sectional view illustrating a semiconductor device according to a first modification of the first embodiment. Referring to FIG. 24, a semiconductor device 1A according to a first modification of the first embodiment differs from the semiconductor device 1 (see FIG. 1, and the like) in that the semiconductor chips $40_1$ and $40_2$ are disposed on the lowest layer of the semiconductor chip stack when the electrode pad forming side of each semiconductor chip is facing upward. In the semiconductor device 1A, the back face of semiconductor chips $40_1$ and $40_2$ serves as a heat dissipation face.

That is, the semiconductor chips $40_1$ and $40_2$ connected to each other in parallel are disposed on the back side of the semiconductor chip $30_5$, while facing the semiconductor chip 301 or the like and the electrode pad forming side in the same direction as each other. Electrode pads 43 of the semiconductor chips $40_1$ and $40_2$ and electrode pads 33 of the semiconductor chip $30_5$ are directly and electrically connected to each other via through-electrodes 37.

In the semiconductor device 1A, lateral faces of the semiconductor chips $40_1$ and $40_2$ are coated with a resin layer 50, and semiconductor chips $30_5$, $30_4$, $30_3$, $30_2$, and $30_1$ are sequentially stacked on the top face of the semiconductor chips $40_1$ and $40_2$ and the resin layer 50. Also, a resin layer 55 is provided that coats lateral faces of the semiconductor chips $30_1$ to $30_5$ and lateral faces of the resin layer 50. A substrate 61 is fixed to the top face of the semiconductor chip $30_1$ and the resin layer 55.

Figure 25:
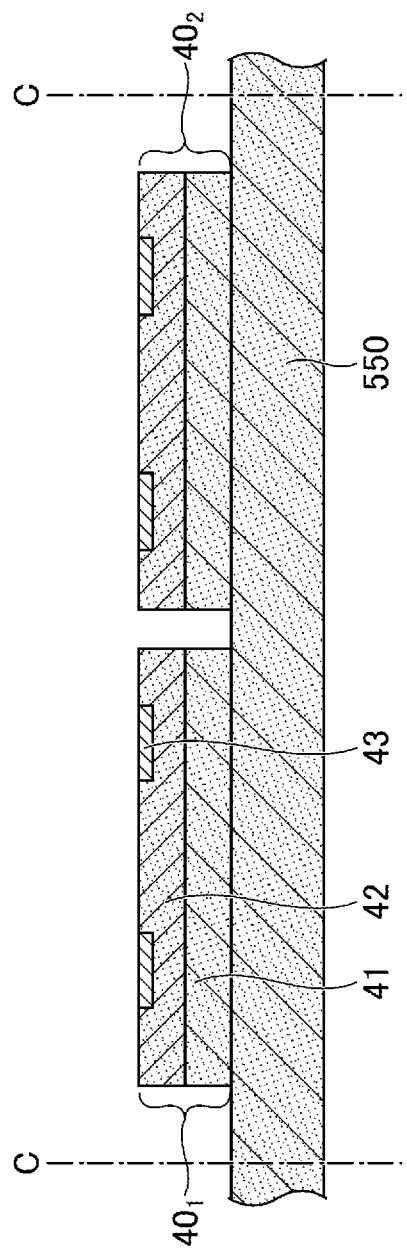
FIG. 25 is a first diagram illustrating a manufacturing process of the semiconductor device according to a first modification of the first embodiment.

In order to manufacture the semiconductor device 1A, separated semiconductor chips $40_1$ and $40_2$ and a substrate 550 are first prepared in a step illustrated in FIG. 25. The substrate 550 has, for example, the same size as that of the substrate 30A. The substrate 550 is, for example, silicon, but may be made with germanium, sapphire, glass, or the like. Similar to the substrate 30A, a plurality of product regions A and a scribe region B separating each product region A are defined in the substrate 550. The semiconductor chips $40_1$ and $40_2$ are then attached to each product area A on one face of the substrate 550 while facing each back side toward the substrate 550 (that is, in a face-up state). The substrate 550 and the semiconductor chips $40_1$ and $40_2$ can be joined together, for example, via an adhesive layer. The material of the adhesive layer and the like are the same as that described with reference to FIG. 4.

Figure 26:
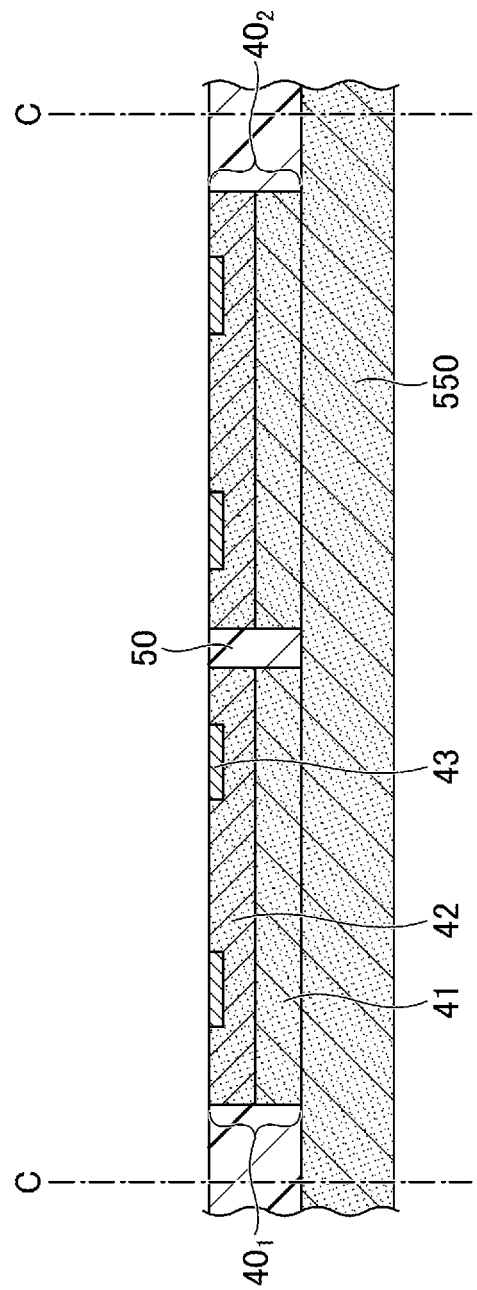
FIG. 26 is a second diagram illustrating a manufacturing process of the semiconductor device according to the first modification of the first embodiment.

Next, in a step illustrated in FIG. 26, a resin layer 50 that coats lateral sides of the semiconductor chips $40_1$ and $40_2$ attached to the respective product regions A is formed on one face of the substrate 550. Also, a rewiring layer (not illustrated) is formed on the semiconductor integrated circuits 42 of the semiconductor chips $40_1$ and $40_2$ to connect the semiconductor chips $40_1$ and $40_2$ to each other in parallel. For example, the rewiring layer may be formed by combining a sputtering method and a plating method with copper or the like.

Figure 27:
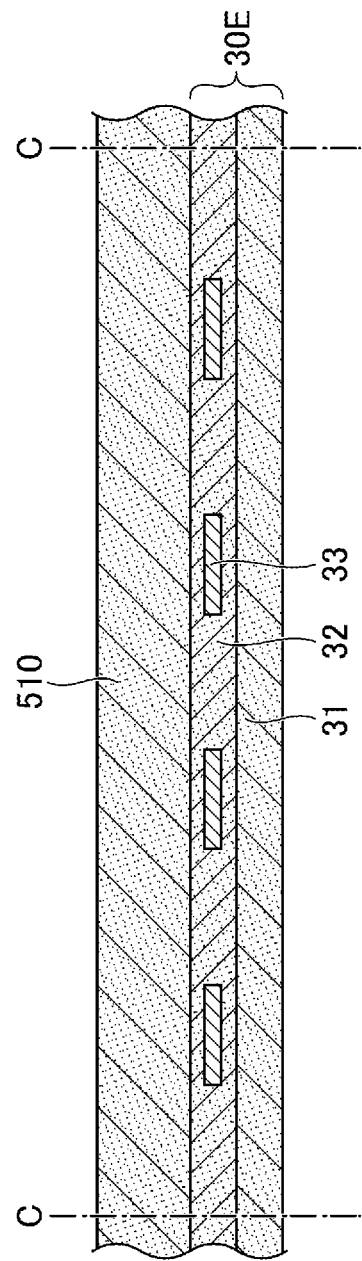
FIG. 27 is a third diagram illustrating a manufacturing process of the semiconductor device according to the first modification of the first embodiment.

Next, in a step illustrated in FIG. 27, the substrate 30E and substrate 510 are prepared in the same manner as those in FIGS. 2 to 5; the substrate 510 is joined to the electrode pad forming side of the substrate 30E; and the back side of the substrate 30E is thinned. The thickness of the thinned substrate 30E may be, for example, about 5 μm to about 15 μm. It is preferable to form an insulating layer on the back side of the thinned substrate 30E by plasma CVD or the like.

Figure 28:
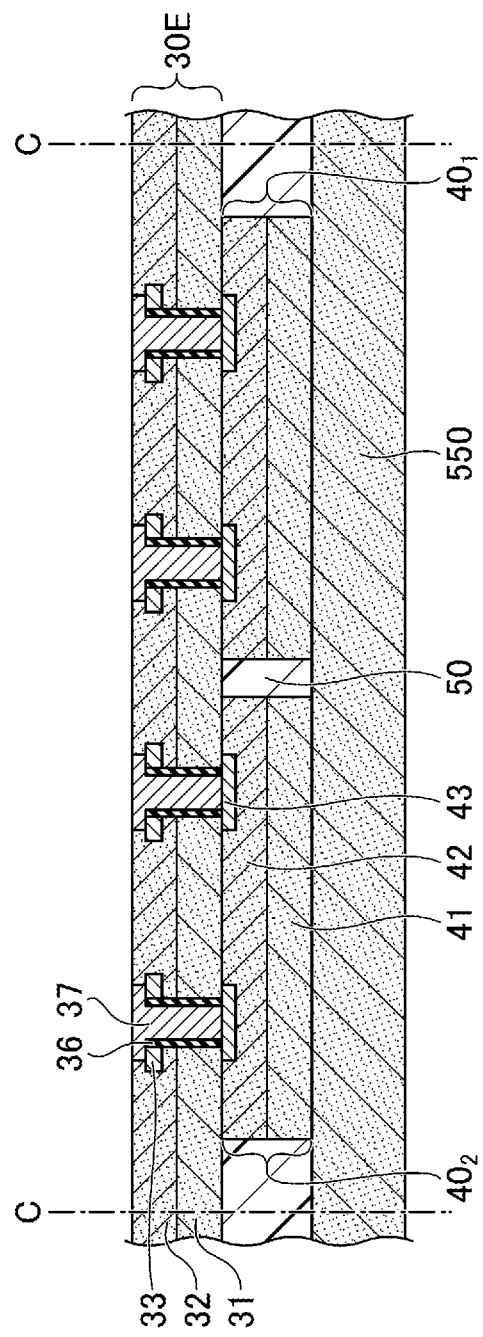
FIG. 28 is a fourth diagram illustrating a manufacturing process of the semiconductor device according to the first modification of the first embodiment.

Next, in a step illustrated in FIG. 28, the structure illustrated in FIG. 27 is stacked on the structure illustrated in FIG. 26 while facing the back side of the substrate 30E to the electrode pad forming side of the semiconductor chips $40_1$ and $40_2$. The semiconductor chips $40_1$ and $40_2$ and the substrate 30E can be directly joined together using, for example, a surface activated junction. Subsequently, the substrate 510 is removed, and an insulating layer 36 and a through electrode 37 are formed, similar to the steps illustrated in FIGS. 9 to 11. The through-electrode 37 is directly and electrically connected to the electrode pads 43 of the semiconductor chips $40_1$ and $40_2$. It should be noted that in the step illustrated in FIG. 26, when rewiring layers are formed on semiconductor integrated circuits 42 of the semiconductor chips $40_1$ and $40_2$, the electrode pads 33 of the substrate 30E are directly and electrically connected to the rewiring layers formed on the semiconductor integrated circuits 42 of the semiconductor chips $40_1$ and $40_2$ via the through-electrodes 37.

Figure 29:
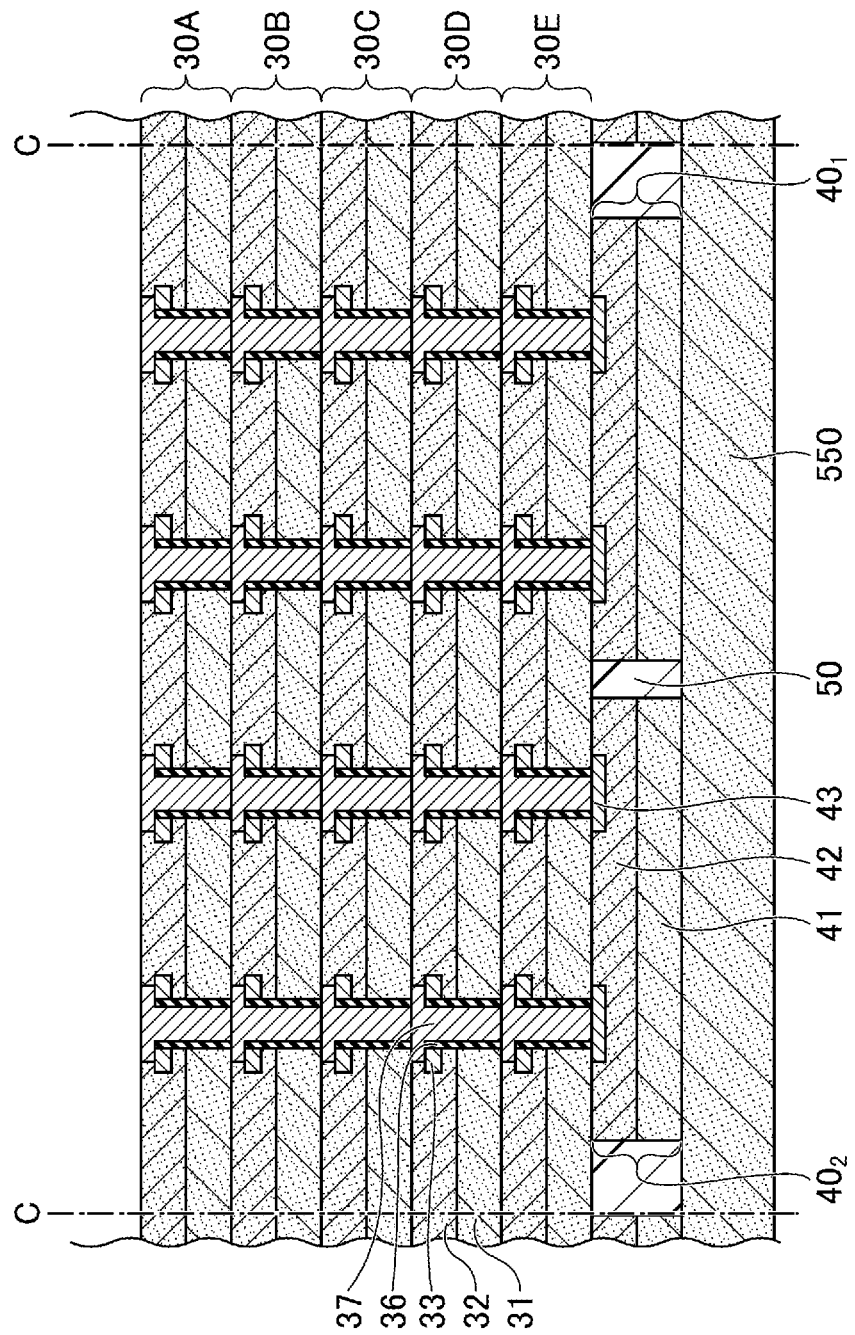
FIG. 29 is a fifth diagram illustrating a manufacturing process of the semiconductor device according to the first modification of the first embodiment.

Next, in a step illustrated in FIG. 29, the substrate 30D, the substrate 30C, the substrate 30B, and the substrate 30A are sequentially stacked on the substrate 30E, similar to the steps illustrated in FIGS. 12 and 13. An insulating layer 36 and a through-electrode 37 are formed each time a substrate is stacked. Thus, the substrates 30A to 30E having defined product regions to be formed as the semiconductor chips are stacked while facing the electrode pad forming sides in the same direction, and a structure in which substrates of the different layers are directly and electrically connected to each other via the through-electrodes 37, is manufactured.

Figure 30:
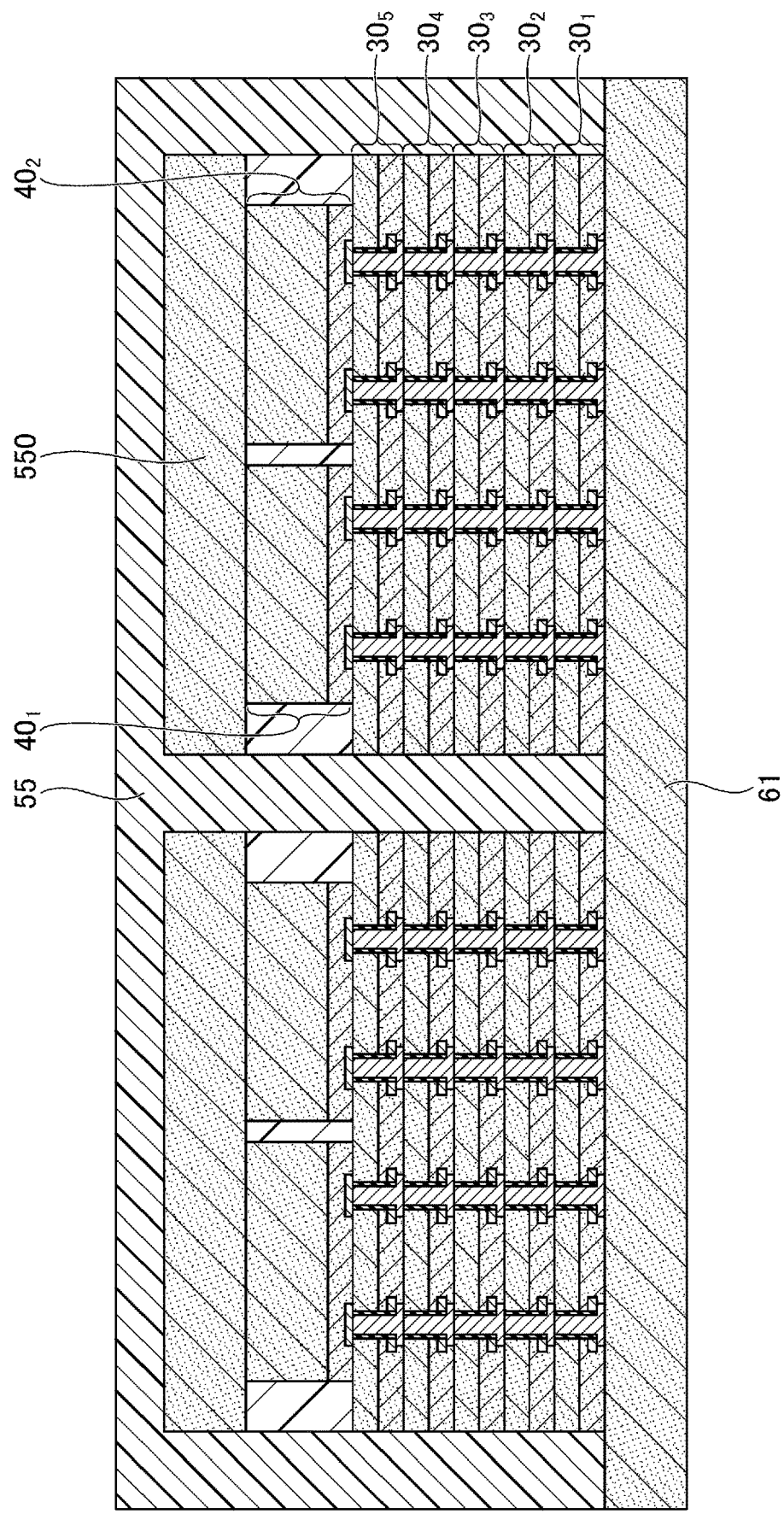
FIG. 30 is a sixth diagram illustrating a manufacturing process of the semiconductor device according to the first modification of the first embodiment.

Next, in a step illustrated in FIG. 30, the structure illustrated in FIG. 29 is cut at the cutting position C to separate each product region from each other and to manufacture a plurality of semiconductor chip stacks having more semiconductor chips disposed on the lowest layer than on the other layers. Then, a plurality of semiconductor chip stacks is attached to one face of the substrate 61. For example, the substrate 61 is a silicon wafer in the present embodiment. The thickness of the substrate 61 may be, for example, about 0.5 mm to about 1.0 mm. The substrate 61 and the semiconductor chip stack can be joined together, for example, via an adhesive layer. The material of the adhesive layer is as described above.

Then, a resin layer 55 that coats at least lateral faces of the semiconductor chip stack is formed on one side of the substrate 61. In this step, after the semiconductor chip stack is thinned in the step illustrated in FIG. 31, it is sufficient for the lateral faces of the semiconductor chip stack to be sealed until the lateral faces of the semiconductor chip stack are completely sealed with the resin layer 55. However, the resin layer 55 may be formed to coat the lateral and back faces of the semiconductor chip stack. The material and forming method of the resin layer 55 are substantially the same as, for example, the material and forming method of the resin layer 50

Figure 31:
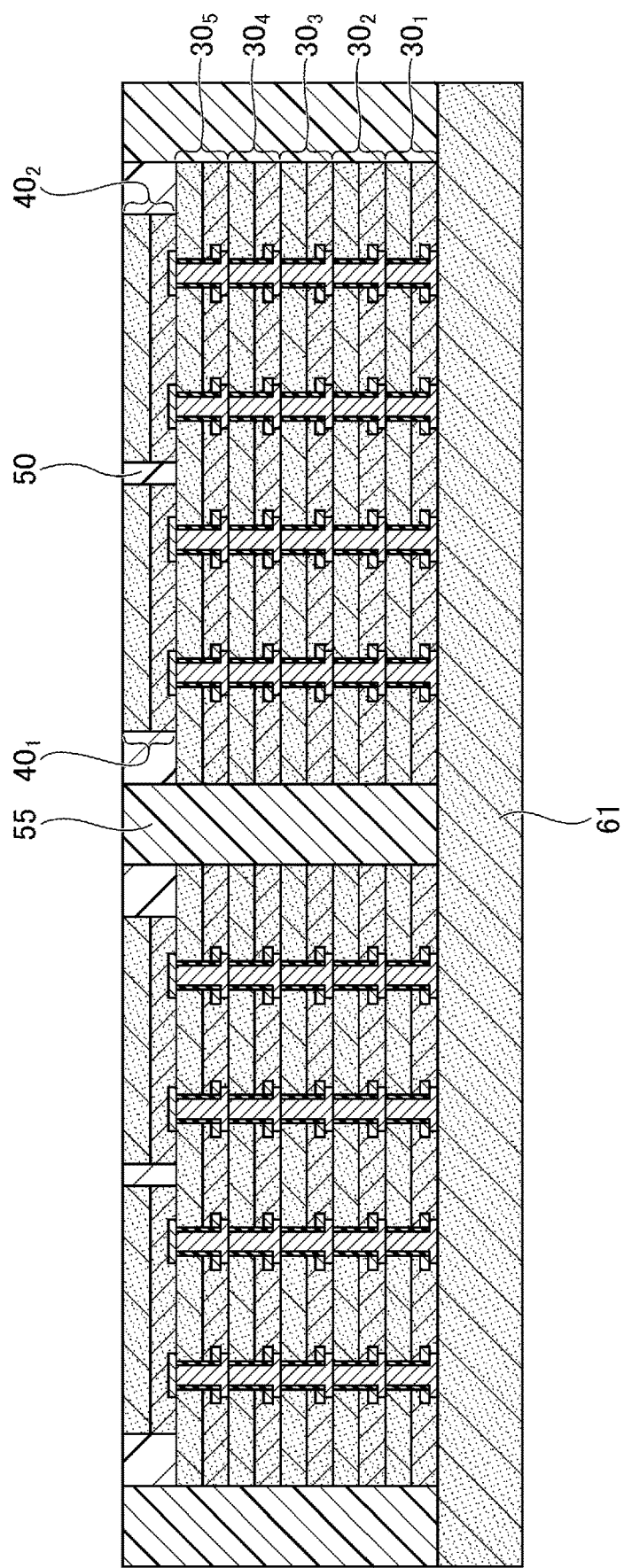
FIG. 31 is a seventh diagram illustrating a manufacturing process of the semiconductor device according to the first modification of the first embodiment.

Next, in a step illustrated in FIG. 31, the unwanted portion of the resin layer 55 and the back sides of the semiconductor chip stacks are ground with a grinder or the like, and the back sides of the semiconductor chip stacks are thinned. Thus, the semiconductor chip stacks are thinned, and the lateral faces of the thinned semiconductor chip stacks are sealed with the resin layer 55. In this case, dry polishing or wet etching may be used together.

Figure 32:
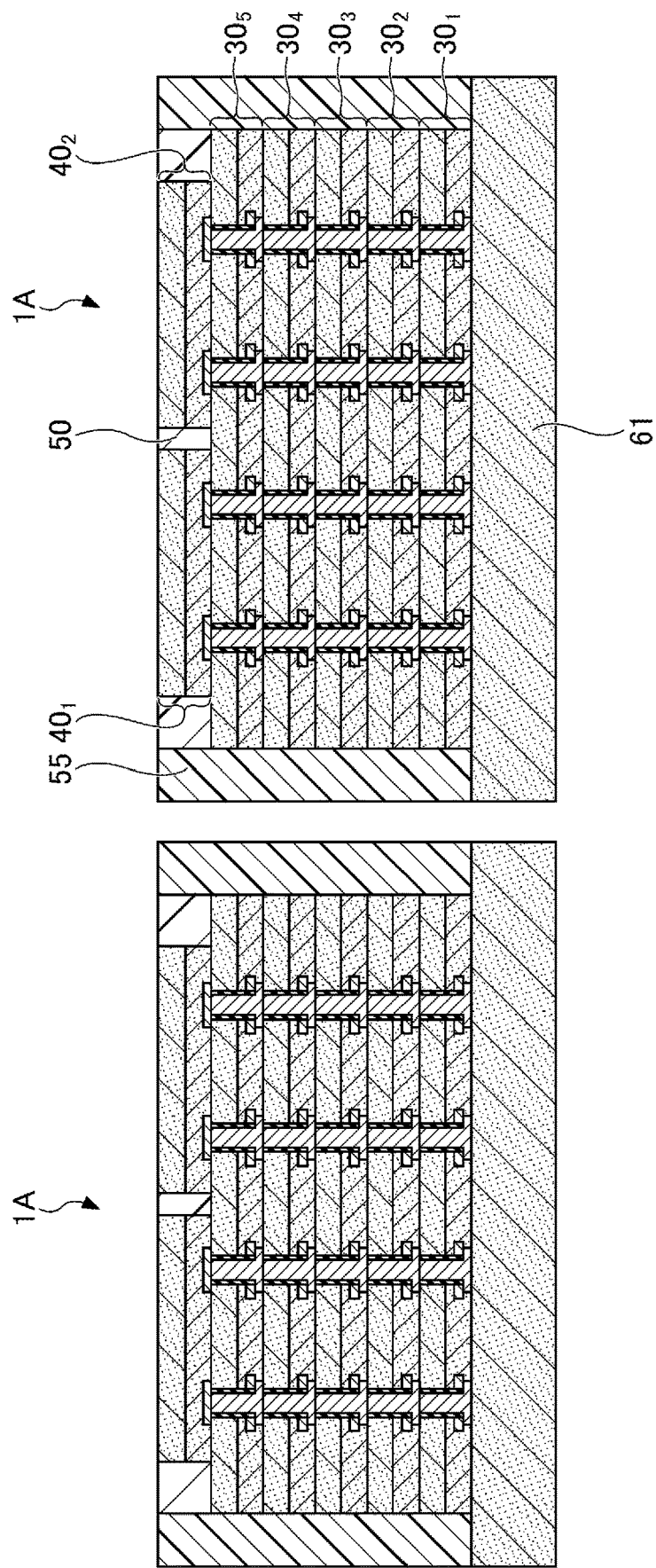
FIG. 32 is an eighth diagram illustrating a manufacturing process of the semiconductor device according to the first modification of the first embodiment.

Next, in a step illustrated in FIG. 32, the structure illustrated in FIG. 31 is divided into respective semiconductor chip stacks. The cuts are made at the location of the resin layer 55 that coats the lateral faces of the adjacent semiconductor chip stacks. This produces a plurality of semiconductor devices 1A.

Thus, when the electrode pad forming side of each semiconductor chip is faced upward, the semiconductor chips $40_1$ and $40_2$ may be positioned at the top layer of the semiconductor chip stack such as the semiconductor device 1, or may be positioned at the bottom layer of the semiconductor chip stack such as the semiconductor device 1A. The semiconductor device 1A is advantageous with respect to heat dissipation because the back side of semiconductor chips $40_1$ and $40_2$ is exposed externally. A heat spreader may be placed on the back side of the semiconductor chips $40_1$ and $40_2$.

Second Modification of First Embodiment

A second modification of the first embodiment illustrates an example in which a plurality of semiconductor chip stacks are placed side by side on a substrate, and are electrically connected to each other. In the second modification of the first embodiment, the description of the same component as that of the embodiment described above may be omitted.

Figure 33:
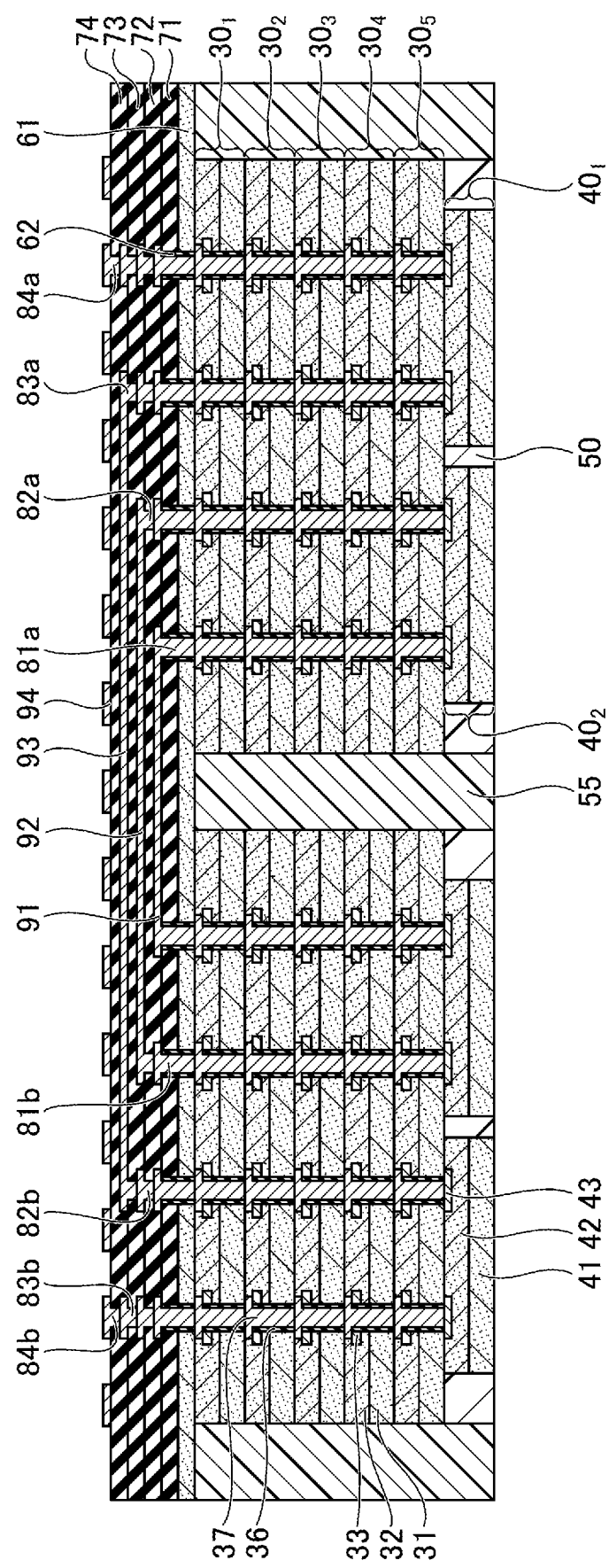
FIG. 33 is a cross-sectional view illustrating a semiconductor device according to a second modification of the first embodiment.

FIG. 33 is a cross-sectional view illustrating a semiconductor device according to a second modification of the first embodiment. Referring to FIG. 33, a semiconductor device 1B according to the second modification of the first embodiment is a semiconductor device 1B in which two semiconductor chip stacks illustrated in FIG. 31 are connected to each other by horizontal and vertical interconnections. In addition, FIG. 33 is illustrated by inverting FIG. 31.

In the semiconductor device 1B, an inorganic insulating layer 71 is provided on the other side of the substrate 61 opposite one side (the top face in FIG. 33). The material of the inorganic insulating layer 71 may be, for example, a material containing $SiO_2$, SiON, $Si_3N_4$, and a porous material and the like. The thickness of the inorganic insulating layer 71 may be, for example, about 0.1 µm to 0.5 µm. The inorganic insulating layer 71 may be made thinner if the insulating property can be secured. Because the deformation of the semiconductor device 1 is proportional to the film deposition temperature and the thickness of the inorganic insulating layer 71, the thickness of the inorganic insulating layer 71 is preferably the minimum thickness in which insulation resistance is obtained, in particular, about 100 nm, in order to reduce the deformation of the semiconductor device 1. The same applies to inorganic insulating layers 72 to 74. By thinning the inorganic insulating layers 71 to 74 to about 100 nm, it is possible to contribute to the overall thinning of the semiconductor device 1.

A vertical interconnection 81a is provided that penetrates through the inorganic insulating layer 71 and the substrate 61 and that is directly and electrically connected to a through-electrode 37 of the semiconductor chip $30_1$ of one semiconductor chip stack. Also, a vertical interconnection 81b is provided that penetrates through the inorganic insulating layer 71 and the substrate 61 and that is directly and electrically connected to a through-electrode 37 of the semiconductor chip $30_1$ of the other semiconductor chip stack. An insulating layer 62 is provided between the vertical interconnections 81a and 81b and the inorganic insulating layer 71 and substrate 61. For example, $SiO_2$, SiON, $Si_3N_4$, or the like may be used as the material of the insulating layer 62. The thickness of the insulating layer 62 may be, for example, about 0.05 μm to about 0.5 μm. If the substrate 61 is electrically insulating, the insulating layer 62 may be eliminated.

In a plan view, the planar shape of the vertical interconnections 81a and 81b may be, for example, circular or polygonal. When the planar shape of the vertical interconnections 81a and 81b is circular, the diameter of the vertical interconnections 81a and 81b may be, for example, about 0.5 μm to about 5 μm. The vertical interconnection means an interconnection is provided inside the organic layer and the substrate and is approximately perpendicular to the surface of the inorganic insulating layer and the substrate, but does not mean that the interconnection is exactly perpendicular to the surface of the inorganic insulating layer or the substrate.

A horizontal interconnection layer 91 is provided on the surface of the inorganic insulating layer 71 opposite the substrate 61 (the top face in FIG. 33) to directly and electrically connect a part of the vertical interconnection 81a to a part of the vertical interconnection 81b. The horizontal interconnection layer 91 includes a horizontal interconnection that directly and electrically connects the vertical interconnection 81a to the vertical interconnection 81b, and an electrode pad that is directly and electrically connected only to the vertical interconnection 81a or only to the vertical interconnection 81b. As described below, the vertical interconnection 81a, the vertical interconnection 81b, and the horizontal interconnection layer 91 may be formed integrally in the same step or may be formed separately from each other.

The material of the vertical interconnections 81a and 81b and the horizontal interconnection layer 91 is, for example, copper. The vertical interconnections 81a and 81b and the horizontal interconnection layer 91 may be a structure formed by stacking a plurality of metals. Specifically, for example, the vertical interconnections 81a and 81b and the horizontal interconnection layer 91 may be a stack formed by stacking an Au layer, an Al layer, a Cu layer, or the like on a Ti layer or a TiN layer. The vertical interconnections 81a and 81b and the horizontal interconnection layer 91 may be made with a stack formed by stacking an Au layer on a Ni layer, a stack formed by sequentially stacking a Pd layer and an Au layer on the Ni layer, and a stack or an interconnection layer having a damascene structure formed by using a layer made with a high melting point metal such as Co, Ta, Ti, TiN, and the like, instead of Ni, and by stacking a Cu layer or an Al layer on the same layer.

In the horizontal interconnection layer 91, the thickness of the horizontal interconnection and the electrode pads may be, for example, about 0.5 μm to about 5 μm. In the horizontal interconnection layer 91, the line/space of the horizontal interconnection may be, for example, about 5 μm/1 μm, about 3 μm/0.5 μm, or about 1 μm/0.5 μm. In the horizontal interconnection layer 91, the diameter of the electrode pads may be as large as, for example, the diameters of the vertical interconnections 81a and 81b or greater than, for example, the diameters of the vertical interconnections 81a and 81b by about 0.5 μm to about 5 μm. The pitch of the electrode pads can be the same as, for example, the pitch of the horizontal interconnections. If the line width of the horizontal interconnection is 3 μm or less, the electrode pad size can be the same as the line width of the horizontal interconnection.

The horizontal interconnection means the interconnection provided on the surface or inside the inorganic insulating layer or the substrate, and is approximately parallel to the surface of the inorganic insulating layer or the substrate, but does not mean that the interconnection is exactly parallel to the surface of the inorganic insulating layer or the substrate.

An inorganic insulating layer 72 that coats the horizontal interconnection layer 91 is provided opposite the substrate 61 of the inorganic insulating layer 71. The material and thickness of the inorganic insulating layer 72 may be similar to, for example, the inorganic insulating layer 71. A vertical interconnection 82a is provided that penetrates through the inorganic insulating layer 72 and is in direct electrical contact with the electrode pads of the horizontal interconnection layer 91. A vertical interconnection 82b is provided that penetrates through the inorganic insulating layer 72 and is in direct electrical contact with the electrode pads of the horizontal interconnection layer 91. In addition, a horizontal interconnection layer 92 is provided on the surface of the inorganic insulating layer 72 opposite the inorganic insulating layer 71 (the top face in FIG. 1). The horizontal interconnection layer 92 includes a horizontal interconnection that directly and electrically connects the vertical interconnection 82a to the vertical interconnection 82b and electrode pads that are electrically connected only to the vertical interconnection 82a or only to the vertical interconnection 82b.

The vertical interconnection 82a, the vertical interconnection 82b, and the horizontal interconnection layer 92 may be formed integrally in the same step or separately as described below. The material of the vertical interconnections 82a and 82b and the horizontal interconnection layer 92, the thickness of the horizontal interconnection and the electrode pads in the horizontal interconnection layer 92 and the line/space of the horizontal interconnection, and the diameter and the pitch of the electrode pads in the horizontal interconnection layer 92 can be the same as, for example, the case of the vertical interconnection 81a, the vertical interconnection 81b, and the horizontal interconnection layer 91.

An inorganic insulating layer 73 that coats the horizontal interconnection layer 92 is provided on a face of the inorganic insulating layer 72 opposite the inorganic insulating layer 71. The material and thickness of the inorganic insulating layer 73 may be similar to, for example, the inorganic insulating layer 71. A vertical interconnection 83a is provided that penetrates through the inorganic insulating layer 73 and is in direct electrical contact with the electrode pads of the horizontal interconnection layer 92. A vertical interconnection 83b is provided that penetrates through the inorganic insulating layer 73 and is in direct electrical contact with the electrode pads of the horizontal interconnection layer 92. In addition, a horizontal interconnection layer 93 is provided on the face of the inorganic insulating layer 73 opposite the inorganic insulating layer 72 (the top face in FIG. 1). The horizontal interconnection layer 93 includes a horizontal interconnection that directly and electrically connects the vertical interconnection 83a to the vertical interconnection 83b, and electrode pads that are electrically connected only to the vertical interconnection 83b.

The vertical interconnection 83a, the vertical interconnection 83b, and the horizontal interconnection layer 93 may be integrally formed in the same step or may be formed separately as described below. The material of the vertical interconnections 83a and 83b and the horizontal interconnection layer 93, the thickness of the horizontal interconnection and the electrode pads in the horizontal interconnection layer 93, the line/space of the horizontal interconnection, and the diameter and pitch of the electrode pads in the horizontal interconnection layer 93 can be the same as, for example, the case of the vertical interconnection 81a, the vertical interconnection 81b, and the horizontal interconnection layer 91.

An inorganic insulating layer 74 that coats the horizontal interconnection layer 93 is provided on a face of the inorganic insulating layer 73 opposite the inorganic insulating layer 72. The material and thickness of the inorganic insulating layer 74 may be similar to, for example, those of the inorganic insulating layer 71. Also, a vertical interconnection 84a is provided that penetrates through the inorganic insulating layer 74 and is in direct electrical contact with the electrode pads of the horizontal interconnection layer 93. Also, a vertical interconnection 84b is provided that penetrates through the inorganic insulating layer 74 and is in direct electrical contact with the electrode pads of the horizontal interconnection layer 93. In addition, because electrode pads 94 that directly and electrically connect the vertical interconnection 84a to the vertical interconnection 84b are provided on the surface of the inorganic insulating layer 74 opposite the inorganic insulating layer 73 (top in FIG. 1), the electrode pads 94 serve as an external connection terminal used to electrically connect the semiconductor device 1 to other substrates, other semiconductor devices, or the like. A horizontal interconnection may be provided on the face of the inorganic insulating layer 74 opposite the inorganic insulating layer 73.

The vertical interconnection 84a, the vertical interconnection 84b, and the electrode pad 94 may be formed integrally in the same process or may be formed separately from each other as described below. The materials of the vertical interconnections 84a and 84b, and the electrode pads 94 may be the same as those of the vertical interconnections 81a and 81b, and the electrode pads thereof. The diameter and pitch of the electrode pads 94 may be the same as, for example, those of the electrode pads of the vertical interconnection 81a, the vertical interconnection 81b, and the horizontal interconnection layer 91.

Figure 34:
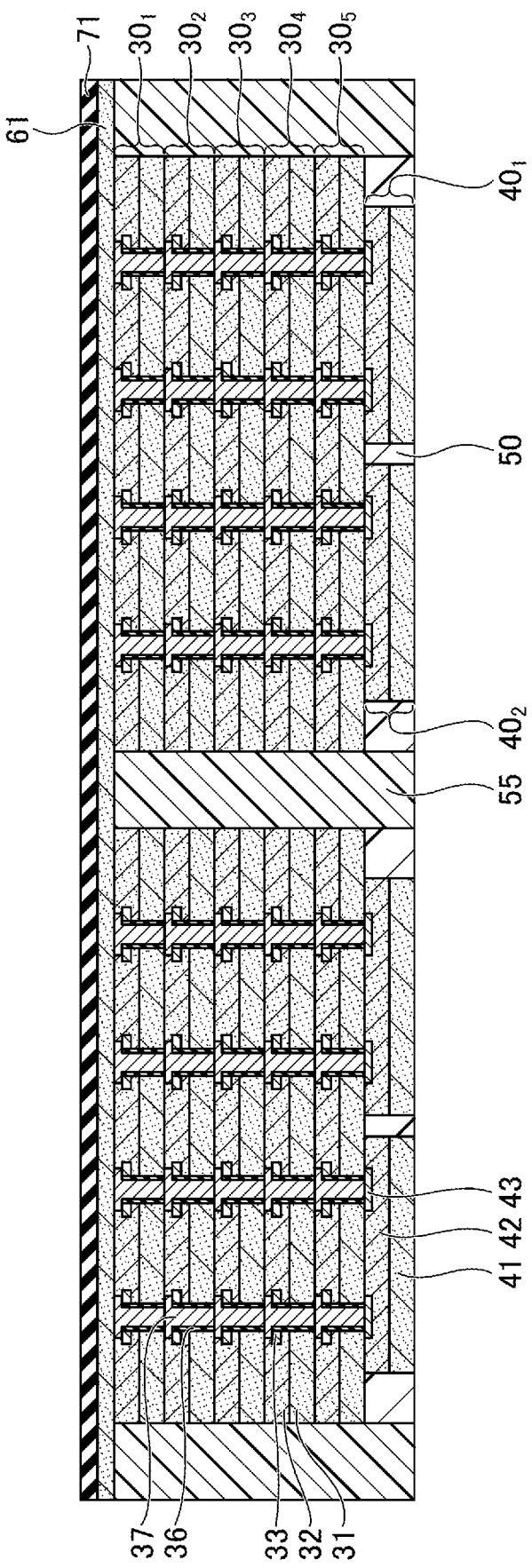
FIG. 34 is a first diagram illustrating a manufacturing process of the semiconductor device according to the second modification of the first embodiment.

In order to manufacture the semiconductor device 1B, the inorganic insulating layer 71 is formed on the other side of the substrate 61 in a process illustrated in FIG. 34 after the process illustrated in FIG. 31. The material and thickness of the inorganic insulating layer 71 are as described above. The inorganic insulating layer 71 may be formed, for example, by a plasma CVD method or the like. The inorganic insulating layer 71 is preferably formed after the surface of the substrate 61 is exposed, for example, by Dilute Hydrogen Fluoride (DHF) cleaning or argon sputtering. Thus, it is possible to form the inorganic insulating layer 71 having a high film density and excellent moisture resistance and electrical insulating resistance. Although the spin coating can only be applied to the wafer shape, the organic insulating layer has a small film density, does not have sufficient moisture resistance and electrical insulating resistance, and does not have micro-machinability. In addition, the organic insulating layer applied by spin coating needs to be densified by heat treatment after the application. In contrast, the inorganic insulating layer 71 is superior to the organic insulating layer in terms of micro-formability and is also superior to the organic insulating layer in that the film density is high and the densification by the heat treatment is not required.

Figure 35:
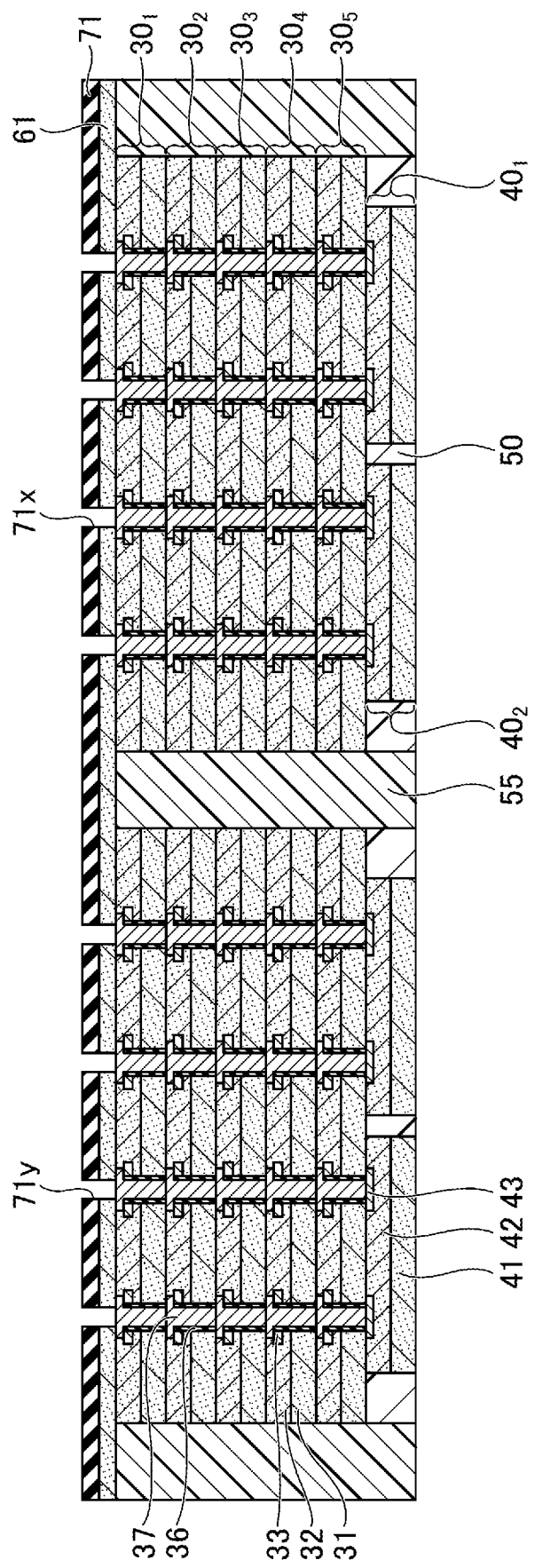
FIG. 35 is a second diagram illustrating a manufacturing process of the semiconductor device according to the second modification of the first embodiment.

Next, in a process illustrated in FIG. 35, via holes 71x and 71y are formed. The via holes 71x are formed so as to penetrate through the inorganic insulating layers 71 and the substrate 61 and to expose the surfaces of the through electrodes 37 of the semiconductor chip $30_1$ of one semiconductor chip stack. The via holes 71y are formed so as to penetrate through the inorganic insulating layers 71 and the substrate 61 and to expose the surfaces of the through electrodes 37 of the semiconductor chip $30_1$ of the other semiconductor chip stack. The via holes 71x and 71y may be formed, for example, by dry etching. The via holes 71x and 71y may be, for example, circular in a plan view and has a diameter of about 0.5 μm to about 5 μm.

Figure 36:
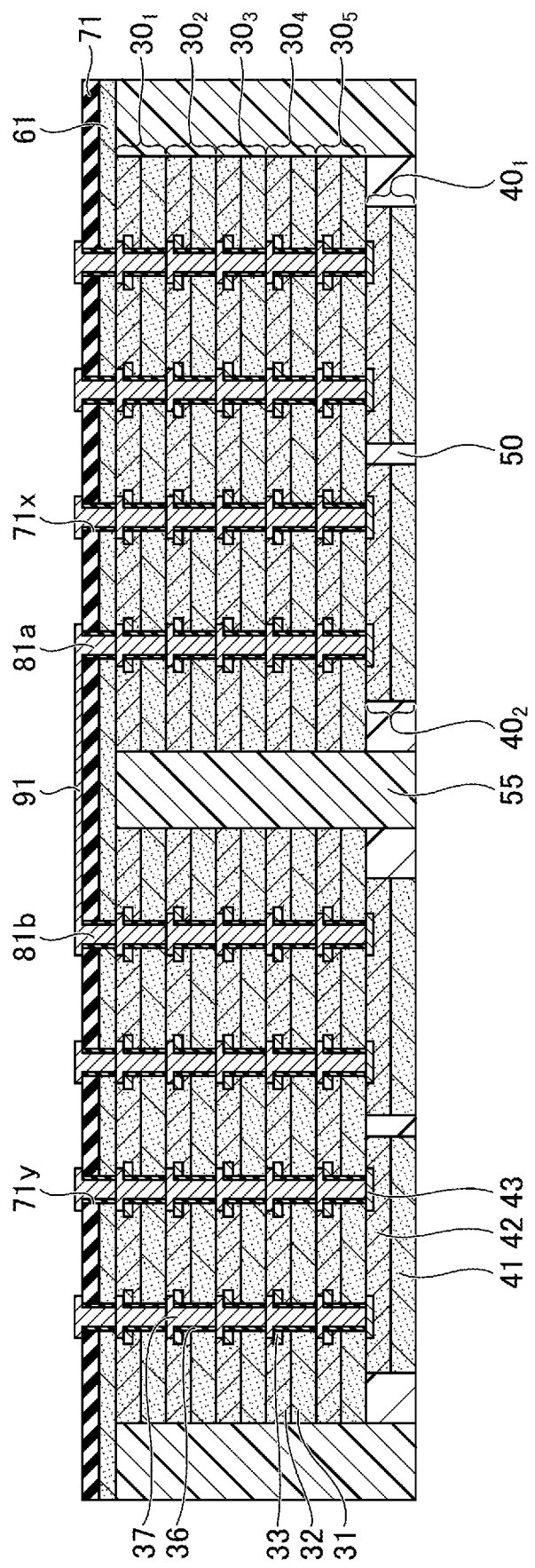
FIG. 36 is a third diagram illustrating a manufacturing process of the semiconductor device according to the second modification of the first embodiment.

Next, in a process illustrated in FIG. 36, the vertical interconnections 81a and 81b and the horizontal interconnection layer 91 are formed. The vertical interconnections 81a and 81b and the horizontal interconnection layer 91 may be integrally formed, for example, by a damascene interconnection. In this case, first, an insulating film (for example, a SiN film having a thickness of about 10 nm to about 50 nm) having a high etch resistance compared to an inorganic insulating layer 71 is formed on the top face of the inorganic insulating layer 71, and a mask layer (for example, an $SiO_2$ film) having the same thickness as the horizontal interconnection layer 91 is formed on the insulating film. The mask layer is etched, thereby forming an opening for opening a region in which the vertical interconnections 81a and 81b and the horizontal interconnection layer 91 are to be formed.

Next, an insulating layer 62 for coating the inner wall surfaces of via holes 71x and 71y is formed. The insulating layer 62 may be formed, for example, by plasma CVD or the like, by forming an insulating layer continuously coating the inner wall surface of via holes 71x and 71y, the through-electrode 37 being exposed in the via holes 71x and 71y and the top face of the electrode pads 43, and by removing a portion other than the portion that coats the inner wall surface of the via holes 71x and 71y by RIE (Reactive Ion Etching) or the like.

Next, for example, a barrier layer (for example, a Ta/TaN layer, a Ti/TiN layer, or the like) is formed by a sputtering method to continuously coat the portions exposed from the opening of the mask layer, and a power supply layer (for example, a Cu layer) is formed on the barrier layer by a sputtering method or the like. Next, an electrolytic plating layer (for example, a Cu layer) is formed on the power supply layer exposed in the opening of the mask layer by an electrolytic plating method that supplies power through the power supply layer. The electrolytic plating layer fills the via holes 71x and 71y and protrudes from the top face of the mask layer. The top face of the electrolytic plating layer protruding from the top face of the mask layer is flattened by CMP or the like. The mask layer is then removed. When the mask layer is removed, an insulating film formed on the lower layer of the mask layer becomes an etching stopper layer. As described above, the vertical interconnections 81a and 81b including the electrolytic plating layer stacked on the power supply layer and the horizontal interconnection layer 91 can be integrally formed.

The vertical interconnections 81a and 81b and the horizontal interconnection layer 91 may be separately formed. In this case, for example, after the insulating layer 62 is formed in the same manner as above, the vertical interconnections 81a and 81b are formed in the via holes 71x and 71y by the same electrolytic plating method as discussed above. In addition, in the vertical interconnections 81a and 81b, the portions protruding from the top face of the inorganic insulating layer 71 are flattened by CMP or the like. Next, a barrier layer (for example, Ta/TaN, Ti/TiN, and the like) that continuously coats the top face of the inorganic insulating layer 71 and the top faces of the vertical interconnections 81a and 81b is formed by a sputtering method, and the like, and a metal layer (for example, Al, and the like) is formed on the barrier layer by the sputtering method. The metal and barrier layers are then patterned by photolithography, thereby forming the horizontal interconnection layer 91.

Next, in a process illustrated in FIG. 37, the processes in FIGS. 34 to 36 are repeated a necessary number of times. However, the insulating layer 62 is not formed in the process. That is, the inorganic insulating layer 72 coating the horizontal interconnection layer 91 is formed on the surface of the inorganic insulating layer 71 opposite the substrate 61 (the top face in FIG. 37) in the same manner as in FIG. 34. After forming a via hole penetrating through the inorganic insulating layer 72, the vertical interconnections 82a and 82b and the horizontal interconnection layer 92 are integrally formed by a damascene interconnection, for example. Then, an inorganic insulating layer 73 is formed on the face of the inorganic insulating layer 72 opposite the inorganic insulating layer 71 (the top face in FIG. 37) to coat the horizontal interconnection layer 92. After forming a via hole penetrating through the inorganic insulating layer 73, the vertical interconnections 83a and 83b and the horizontal interconnection layer 93 are formed integrally by a damascene interconnection, for example. Subsequently, an inorganic insulating layer 74 coating the horizontal interconnection layer 93 is formed on the face of the inorganic insulating layer 73 opposite the inorganic insulating layer 72 (top face in FIG. 37). After forming a via hole penetrating through the inorganic insulating layer 74, a vertical interconnections 84a and 84b, and an electrode pad 94 are integrally formed, for example, by a damascene interconnection. In this process, a necessary portion of the through electrodes 37 of one semiconductor chip stack 30₁ and a necessary portion of the through electrodes 37 of the other semiconductor chip stack 30₁ are electrically connected to each other via the vertical interconnections 81a to 83a, the vertical interconnections 81b to 83b, and the horizontal interconnections of the horizontal interconnection layers 91 to 93. Thus, the semiconductor device 1B illustrated in FIG. 33 is manufactured by the above-mentioned process.

As described in the process of FIG. 36, the vertical interconnections 82a and 82b may be formed separately from horizontal interconnection layer 92. Also, the vertical interconnections 83a and 83b may be formed separately from the horizontal interconnection layer 93. Similarly, a vertical interconnection 84b may be formed separately from the electrode pad 94. Also, they may be optionally combined with the damascene interconnection. For example, the vertical interconnections 81a and 81b and the horizontal interconnection layer 91 are separately formed, and the second and subsequent interconnections, that is, the vertical interconnections 82a and 82b and the horizontal interconnection layer 92, the vertical interconnections 83a and 83b and the horizontal interconnection layer 93, and the vertical interconnection 84b and the electrode pad 94 may be formed as the damascene interconnection.

The two semiconductor chip stacks illustrated in FIG. 20 may be electrically connected to each other via horizontal and vertical interconnections formed on the inorganic insulating layer in substantially the same as that of the semiconductor device 1B.

Thus, the semiconductor device 1B uses the inorganic insulating layers 71 to 74 instead of the organic material as an insulating layer for providing an interconnection that electrically connects one semiconductor chip stack to the other semiconductor chip stack. The inorganic insulating layers 71 to 74 are then used for multilayer interconnection including vertical and horizontal interconnections at the wafer level. Thus, it is possible to decrease the leakage current between the multilayer interconnections and to increase the density.

In the semiconductor device 1B, the resistance of the bumps and the parasitic electrical capacitance of the bumps can be eliminated by performing multilayer interconnection at the wafer level and by implementing electrical connection without using the bumps conventionally used for connections. For example, although the series resistance of the conventional interconnection and the bump may be about 100 mΩ, the resistance of the semiconductor device 1B can be about 70 mΩ. That is, in the semiconductor device 1B, the resistance of the horizontal interconnection can be reduced by about 30% compared to the conventional method.

Further, in the semiconductor device 1B, by performing multilayer interconnection at the wafer level, the line/space of the horizontal interconnection can be about 5 μm/1 μm, about 3 μm/0.5 μm, and about 1 μm/0.5 μm. Conventionally, although the line/space of the horizontal interconnection was about 2 μm/2 μm, in the semiconductor device 1B, the degree of integration of the horizontal interconnection can be increased up to about 4 times that of the conventional interconnection, and the density of the horizontal interconnection increases in proportion to the number of multilayered interconnections. Thus, it is possible to increase the density of interconnection connecting one semiconductor chip stack to the other semiconductor chip stack.

Thus, in the semiconductor device 1B, because the bit width of the data bus is widened, broadening the band width is possible. For example, by quadrupling the interconnection density per inorganic insulating layer and by stacking four inorganic insulating layers, the bandwidth can be increased by 16 times. In other words, if the same bandwidth is used, the data can be transferred at a frequency of $1/16$, and the power consumption can be reduced to $1/16$.

In the semiconductor device 1B, the vertical interconnection formed in the inorganic insulating layers 71 to 74 and the electrode pads of each semiconductor chip stack are directly and electrically connected without bumps. Thus, the interconnection resistance is reduced, and the broadband semiconductor device 1B with low power consumption can be implemented. Further, by eliminating the mechanical connection using bumps, high reliability against temperature stress can be implemented with respect to an interconnection connecting one semiconductor chip stack to the other semiconductor chip stack.

Further, the length of the vertical wiring may be about 10 μm in the semiconductor device 1 compared to about 50 μm in the conventional wiring. As a result, in the semiconductor device 1, if the cross-sectional area of the vertical wiring is constant, the resistance per one layer of the vertical wiring can be set to $1/5$ of that of the related art.

Thus, as discussed above, a semiconductor device according to the embodiments can achieve reduced impedance between interconnected semiconductor chips, higher reliability, and lower cost.

Although the preferred embodiments have been described in detail above, various modifications and substitutions can be applied to the embodiments described above without departing from the scope of the claims.

For example, in the above-described embodiment, the case in which a semiconductor substrate (silicon wafer) having a circular shape in a plan view is used is used as an example. However, the semiconductor substrate is not limited to a circular shape in a plan view, but for example, a panel-like shape such as a rectangular shape in a plan view may be used.

The material of the semiconductor substrate is not limited to silicon, and may be, for example, germanium or sapphire.

What is claimed is:

1. A method for manufacturing a semiconductor device, the method comprising:
    preparing a plurality of first substrates to be formed into a first semiconductor chip, each of the plurality of first substrates having a plurality of first product regions defined thereon;
    stacking the plurality of first substrates while facing a first electrode pad forming side of each of the plurality of first substrates in a same direction, thereby directly and electrically connecting different layers of the plurality of first substrates to each other via a through electrode;
    preparing a second substrate having a plurality of second product regions defined thereon;
    attaching a plurality of second semiconductor chips to the plurality of second product regions of one face of the second substrate on one-to-one basis while facing a second electrode pad forming side of each of the plurality of second semiconductor chips in a same direction;
    stacking the plurality of second semiconductor chips attached to the second substrate onto the first electrode pad forming side of a top layer of the first substrates while facing the second electrode pad forming-side in a same direction;
    removing the second substrate from the second semiconductor chips;
    directly and electrically connecting first electrode pads of the top layer of the first substrates to second electrode pads of the plurality of second semiconductor chips via through-electrodes;
    connecting the plurality of second semiconductor chips to each other in parallel; and
    separating each of the plurality of first and second product regions, thereby manufacturing a plurality of semiconductor chip stacks including more semiconductor chips in the top layer than in the other layers.

2. The method as claimed in claim 1, further comprising:
    thinning a back side of each of the plurality of first substrates before the stacking of the plurality of first substrates.

3. The method as claimed in claim 1, further comprising:
    thinning a back side of each of the plurality of second semiconductor chips.

4. The method as claimed in claim 1, further comprising:
    forming a first resin layer to coat lateral faces of the plurality of second semiconductor chips.

5. The method as claimed in claim 1, further comprising:
    preparing a third substrate; and
    attaching the semiconductor chip stack on a face of the third substrate while facing the first and second electrode pad forming sides to the third substrate.

6. The method as claimed in claim 5, further comprising:
    forming a second resin layer to coat lateral faces of the semiconductor chip stack on the face of the third substrate.

7. The method as claimed in claim 1,
    wherein the plurality of first semiconductor chips includes a memory chip and a controller chip, and
    wherein the plurality of second semiconductor chips includes a logic chip.

8. A method for manufacturing a semiconductor device, the method comprising:
    preparing a second substrate having a plurality of product regions defined on a face;
    attaching a plurality of second semiconductor chips to the plurality of product regions on one-to-one basis while facing back sides of the plurality of second semiconductor chips to the second substrate;
    connecting the plurality of second semiconductor chips to each other in parallel;
    preparing a plurality of first substrates to be formed into a first semiconductor chip, each of the plurality of first substrates having a plurality of first product regions defined thereon;
    stacking the plurality of first substrates onto the plurality of second semiconductor chips while facing each of electrode pad forming sides in a same direction, thereby directly and electrically connecting a bottom layer of the plurality of first substrates to the plurality of second semiconductor chips, and different layers of the plurality of first substrates to each other; and
    separating each of the plurality of product regions, thereby manufacturing a plurality of semiconductor chip stacks including more semiconductor chips in the bottom layer than the other layers.

9. A semiconductor device comprising:
    a plurality of first semiconductor chips stacked with each other while facing electrode pad forming sides thereof in a same direction;
    a first through-electrode directly and electrically connecting different layers of the plurality of first semiconductor chips to each other;
    a plurality of second semiconductor chips disposed on an electrode pad forming side of a top layer of the plurality of first semiconductor chips while facing electrode pad forming sides of the plurality of second semiconductor chips in a same direction;
    a second through-electrode directly and electrically connecting electrode pads of the plurality of second semiconductor chips to electrode pads of the top layer of the plurality of first semiconductor chips; and
    an interconnection connecting the plurality of second semiconductor chips to each other in parallel.

10. The semiconductor device as claimed in claim 9, wherein a back face of a bottom layer of the plurality of first semiconductor chips serves as a heat dissipation face.

11. The semiconductor device as claimed in claim 9,
    wherein back faces of the plurality of second semiconductor chips serve as heat dissipation faces.

12. The semiconductor device as claimed in claim 9, further comprising:
    a first resin to coat lateral faces of the plurality of second semiconductor chips.

13. The semiconductor device as claimed in claim 12, further comprising:
    a second resin to coat lateral faces of the plurality of first semiconductor chips and lateral faces of the first resin.

14. The semiconductor device as claimed in claim 9,
    wherein the plurality of first semiconductor chips includes a memory chip and a controller chip, and
    wherein the plurality of second semiconductor chips includes a logic chip.

15. A semiconductor device comprising:
    a plurality of first semiconductor chips stacked with each other while facing electrode pad forming sides thereof in a same direction;

a first through-electrode directly and electrically connecting different layers of the plurality of first semiconductor chips to each other;
a plurality of second semiconductor chips disposed on an electrode pad forming side of a bottom layer of the plurality of first semiconductor chips while facing electrode pad forming sides of the plurality of second semiconductor chips in a same direction;
a second through-electrode directly and electrically connecting electrode pads of the plurality of second semiconductor chips to back sides of electrode pads of the bottom layer of the plurality of first semiconductor chips; and
an interconnection connecting the plurality of second semiconductor chips to each other in parallel.

* * * * *